US012656384B2

(12) United States Patent
Yang et al.

(10) Patent No.: US 12,656,384 B2
(45) Date of Patent: Jun. 16, 2026

(54) ELECTROSTATIC FIELD STRENGTH MEASUREMENT

(71) Applicant: Taiwan Semiconductor Manufacturing Company Limited, Hsin-Chu (TW)

(72) Inventors: Ming Da Yang, Taichung (TW);
Yi-Chen Li, Taichung (TW);
Chun-Hsuan Lin, Hsinchu County (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 481 days.

(21) Appl. No.: 18/196,107

(22) Filed: May 11, 2023

(65) Prior Publication Data

US 2024/0118329 A1 Apr. 11, 2024

Related U.S. Application Data

(60) Provisional application No. 63/413,484, filed on Oct. 5, 2022.

(51) Int. Cl.
| | |
|---|---|
| *G01R 29/12* | (2006.01) |
| *H10P 72/00* | (2026.01) |
| *H10P 74/00* | (2026.01) |

(52) U.S. Cl.
CPC .......... *G01R 29/12* (2013.01); *H10P 72/0604* (2026.01); *H10P 74/23* (2026.01)

(58) Field of Classification Search
CPC ........ G01R 29/12; G01R 29/14; G01R 29/24; H01L 21/67253; H01L 22/20;
(Continued)

(56) References Cited

U.S. PATENT DOCUMENTS

| | | | |
|---|---|---|---|
| 5,280,173 A | 1/1994 | Morse et al. | |
| 2006/0062275 A1* | 3/2006 | Teng ...................... | G01J 5/025 |
| | | | 374/124 |

(Continued)

FOREIGN PATENT DOCUMENTS

| | | |
|---|---|---|
| JP | H0236366 A | 2/1990 |
| JP | H04320975 A | 11/1992 |

(Continued)

OTHER PUBLICATIONS

Master degree thesis titled "Electric field measurements on streamers using electric field induced second-harmonic generation", by Britt Broekman, published in year 2021, [online], retrieved from <https://research.tue.nl/en/studentTheses/2f417100-9da7-4e4c-9f3c-e863e30f0169> (Year: 2021).*

(Continued)

*Primary Examiner* — Charles Cai
(74) *Attorney, Agent, or Firm* — Cooper Legal Group, LLC

(57) ABSTRACT

An apparatus is provided. The apparatus includes a laser generation device configured to emit a laser signal to a semiconductor fabrication component. The apparatus includes a reflection detection device configured to receive a reflection signal comprising light, of the laser signal, reflected by a surface of the semiconductor fabrication component. The reflection detection device includes an optical filter. The optical filter is configured to block light, of the reflection signal, that has a wavelength outside a defined range of wavelengths. The optical filter is configured to provide filtered light, from the reflection signal, that has a wavelength within the defined range of wavelengths. The reflection detection device includes a light sensor configured to generate an electrical signal based upon the filtered light. The apparatus includes a computer configured to determine, based upon the electrical signal, measures of electrostatic (Continued)

field strength at the surface of the semiconductor fabrication component.

20 Claims, 12 Drawing Sheets

(58) Field of Classification Search
CPC .. H01L 22/12; H01L 21/67242; G01J 1/0433; G01J 2001/446; H10F 39/10
See application file for complete search history.

(56) References Cited

U.S. PATENT DOCUMENTS

| | | | |
|---|---|---|---|
| 2010/0091372 A1 | 4/2010 | Yamanoi et al. | |
| 2013/0343422 A1* | 12/2013 | Laufer | G03F 7/70858 |
| | | | 374/55 |
| 2017/0263718 A1* | 9/2017 | West | H10D 30/0297 |
| 2022/0196558 A1* | 6/2022 | Hopkins | H01J 37/32082 |
| 2022/0271724 A1 | 8/2022 | Quan | |
| 2023/0109672 A1* | 4/2023 | Lim | H01J 37/32568 |
| | | | 156/345.28 |
| 2024/0007808 A1* | 1/2024 | Quan | H04R 29/001 |
| 2024/0038600 A1* | 2/2024 | Huang | G01N 21/8422 |

FOREIGN PATENT DOCUMENTS

| | | |
|---|---|---|
| JP | 2011169615 A | 9/2011 |
| KR | 20210122611 A | 10/2021 |
| TW | 201724181 A | 7/2017 |
| TW | 201742158 A | 12/2017 |
| TW | I700771 B | 8/2020 |

OTHER PUBLICATIONS

Office Action received in corresponding Korean patent application No. 10-2023-0132789, dated Jan. 17, 2025, 14 pages.

First Office Action and Search Report cited in corresponding Taiwanese patent application No. 112125209, dated Apr. 17, 2024, 6 pages.

Office Action received in corresponding Korean patent application No. 10-2023-0132789, dated Nov. 28, 2025, 1 18 pages.

\* cited by examiner 104
206
204
210
208
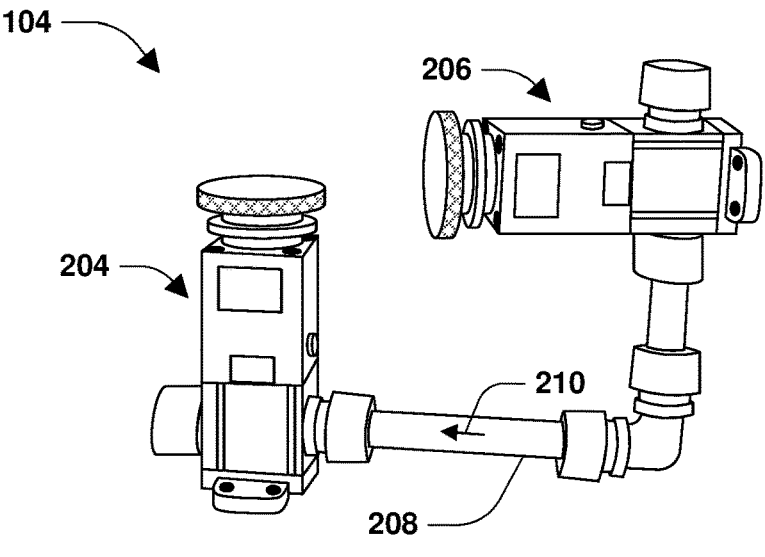
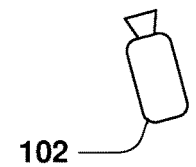
102
FIG. 2A
220
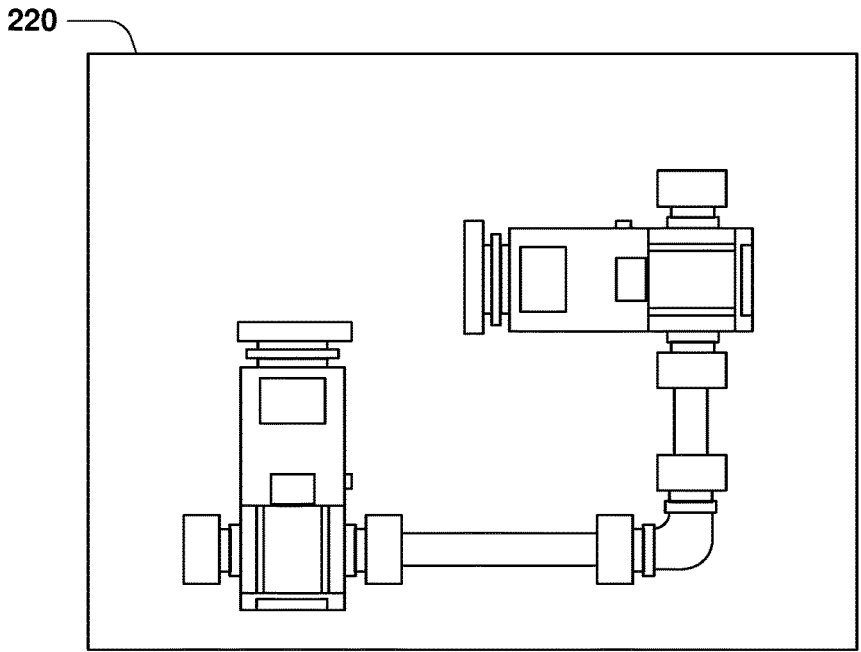
FIG. 2B

230

240

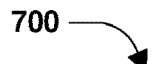

700

┌─────────────────────────────────────────────────────────┐ ⌐ 702
│                                                         │
│   EMIT LASER SIGNAL TO SEMICONDUCTOR FABRICATION COMPONENT   │
│                                                         │
└─────────────────────────────────────────────────────────┘

┌─────────────────────────────────────────────────────────┐ ⌐ 704
│                                                         │
│   RECEIVE REFLECTION SIGNAL COMPRISING LIGHT, OF LASER SIGNAL,   │
│   REFLECTED BY SURFACE OF SEMICONDUCTOR FABRICATION COMPONENT   │
│                                                         │
└─────────────────────────────────────────────────────────┘

┌─────────────────────────────────────────────────────────┐ ⌐ 706
│                                                         │
│   FILTER REFLECTION SIGNAL TO PROVIDE FILTERED LIGHT THAT HAS   │
│   WAVELENGTH WITHIN DEFINED RANGE OF WAVELENGTHS         │
│                                                         │
└─────────────────────────────────────────────────────────┘

┌─────────────────────────────────────────────────────────┐ ⌐ 708
│                                                         │
│   GENERATE ELECTRICAL SIGNAL BASED UPON FILTERED LIGHT   │
│                                                         │
└─────────────────────────────────────────────────────────┘

┌─────────────────────────────────────────────────────────┐ ⌐ 710
│                                                         │
│   DETERMINE, BASED UPON ELECTRICAL SIGNAL, MEASURES OF   │
│   ELECTROSTATIC FIELD STRENGTH AT SURFACE OF SEMICONDUCTOR   │
│   FABRICATION COMPONENT                                 │
│                                                         │
└─────────────────────────────────────────────────────────┘

Figure 8:
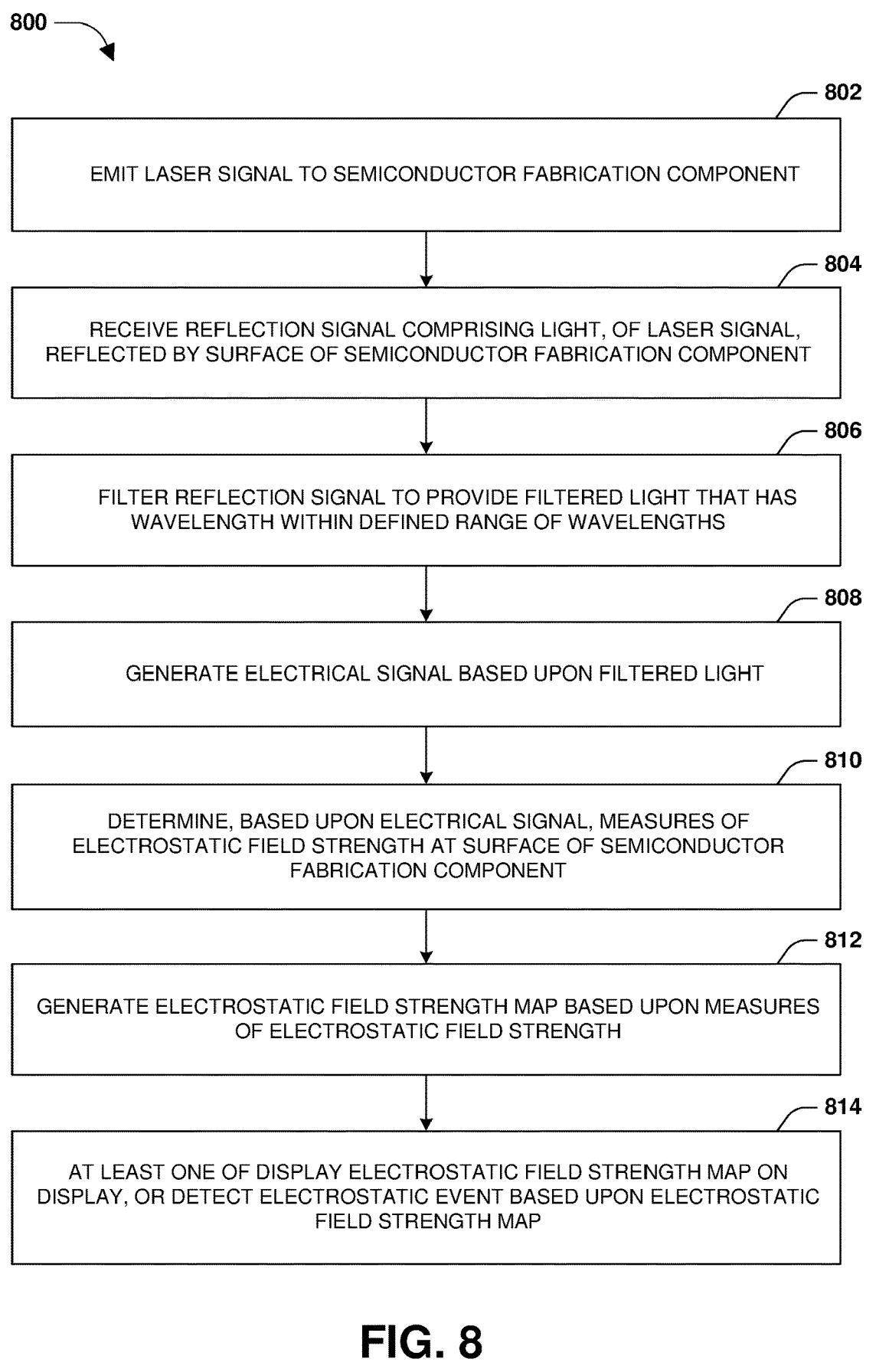

EMIT LASER SIGNAL TO SEMICONDUCTOR FABRICATION COMPONENT

804

RECEIVE REFLECTION SIGNAL COMPRISING LIGHT, OF LASER SIGNAL, REFLECTED BY SURFACE OF SEMICONDUCTOR FABRICATION COMPONENT

806

FILTER REFLECTION SIGNAL TO PROVIDE FILTERED LIGHT THAT HAS WAVELENGTH WITHIN DEFINED RANGE OF WAVELENGTHS

808

GENERATE ELECTRICAL SIGNAL BASED UPON FILTERED LIGHT

810

DETERMINE, BASED UPON ELECTRICAL SIGNAL, MEASURES OF ELECTROSTATIC FIELD STRENGTH AT SURFACE OF SEMICONDUCTOR FABRICATION COMPONENT

812

GENERATE ELECTROSTATIC FIELD STRENGTH MAP BASED UPON MEASURES OF ELECTROSTATIC FIELD STRENGTH

814

AT LEAST ONE OF DISPLAY ELECTROSTATIC FIELD STRENGTH MAP ON DISPLAY, OR DETECT ELECTROSTATIC EVENT BASED UPON ELECTROSTATIC FIELD STRENGTH MAP

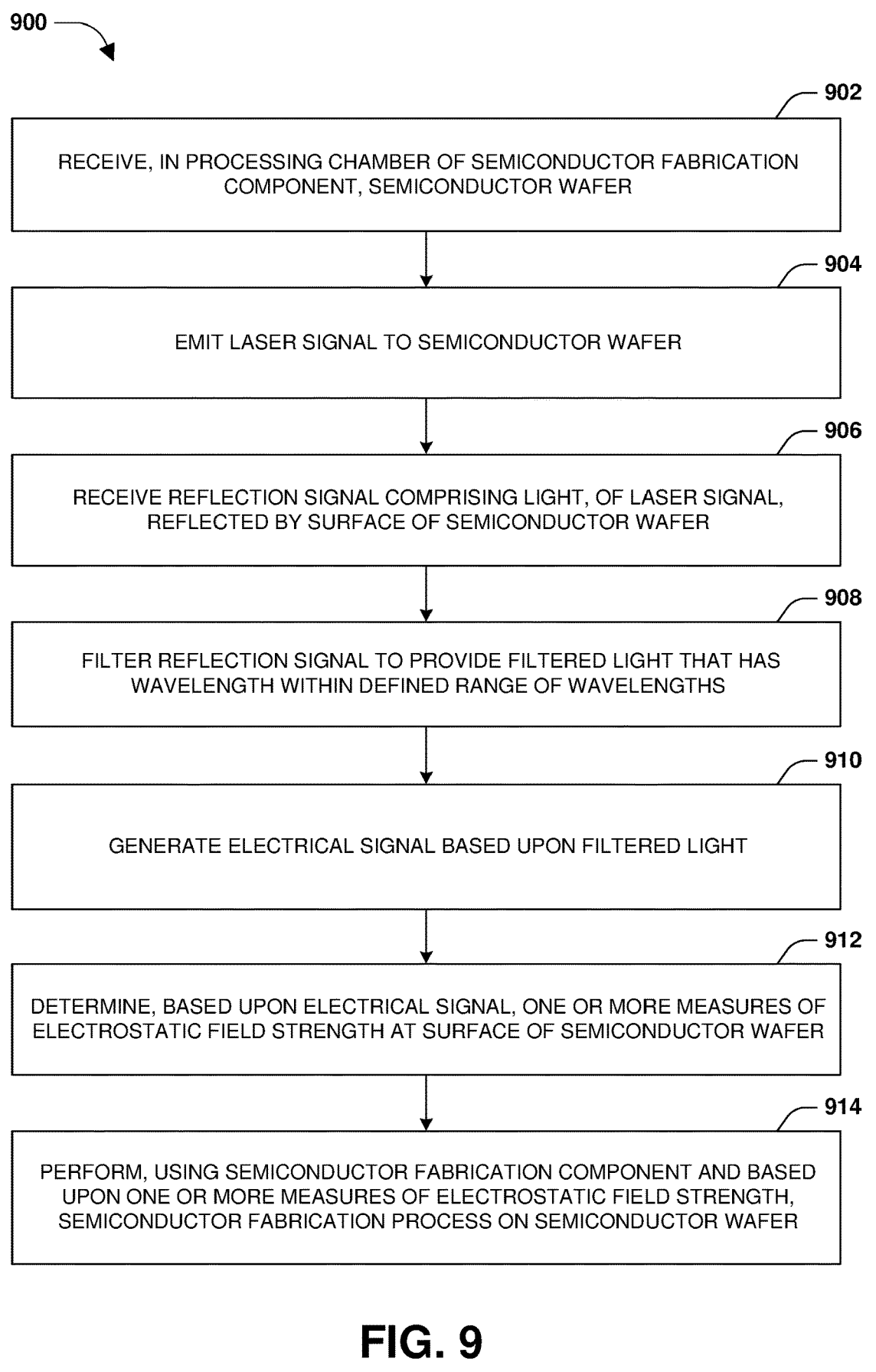

RECEIVE, IN PROCESSING CHAMBER OF SEMICONDUCTOR FABRICATION COMPONENT, SEMICONDUCTOR WAFER

904

EMIT LASER SIGNAL TO SEMICONDUCTOR WAFER

906

RECEIVE REFLECTION SIGNAL COMPRISING LIGHT, OF LASER SIGNAL, REFLECTED BY SURFACE OF SEMICONDUCTOR WAFER

908

FILTER REFLECTION SIGNAL TO PROVIDE FILTERED LIGHT THAT HAS WAVELENGTH WITHIN DEFINED RANGE OF WAVELENGTHS

910

GENERATE ELECTRICAL SIGNAL BASED UPON FILTERED LIGHT

912

DETERMINE, BASED UPON ELECTRICAL SIGNAL, ONE OR MORE MEASURES OF ELECTROSTATIC FIELD STRENGTH AT SURFACE OF SEMICONDUCTOR WAFER

914

PERFORM, USING SEMICONDUCTOR FABRICATION COMPONENT AND BASED UPON ONE OR MORE MEASURES OF ELECTROSTATIC FIELD STRENGTH, SEMICONDUCTOR FABRICATION PROCESS ON SEMICONDUCTOR WAFER

FIG. 9

ELECTROSTATIC FIELD STRENGTH MEASUREMENT

CROSS-REFERENCE TO RELATED APPLICATION

This application claims priority to U.S. Patent Application 63/413,484, titled "APPARATUS FOR ELECTROSTATIC CHARGE DETECTION" and filed on Oct. 5, 2022, which is incorporated herein by reference.

BACKGROUND

Semiconductor devices are formed on, in, and/or from semiconductor wafers, and are used in a multitude of electronic devices, such as mobile phones, laptops, desktops, tablets, watches, gaming systems, and various other industrial, commercial, and consumer electronics. One or more components are used in semiconductor fabrication to form semiconductor devices on, in, and/or from a semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A illustrates a perspective view of an apparatus and a component, in accordance with some embodiments.

FIG. 2B illustrates a visual image of a component generated using an image sensor of an apparatus, in accordance with some embodiments.

FIG. 7 is a flow diagram illustrating a method, in accordance with some embodiments.

FIG. 8 is a flow diagram illustrating a method, in accordance with some embodiments.

FIG. 9 is a flow diagram illustrating a method, in accordance with some embodiments.

DETAILED DESCRIPTION

Figure 1:
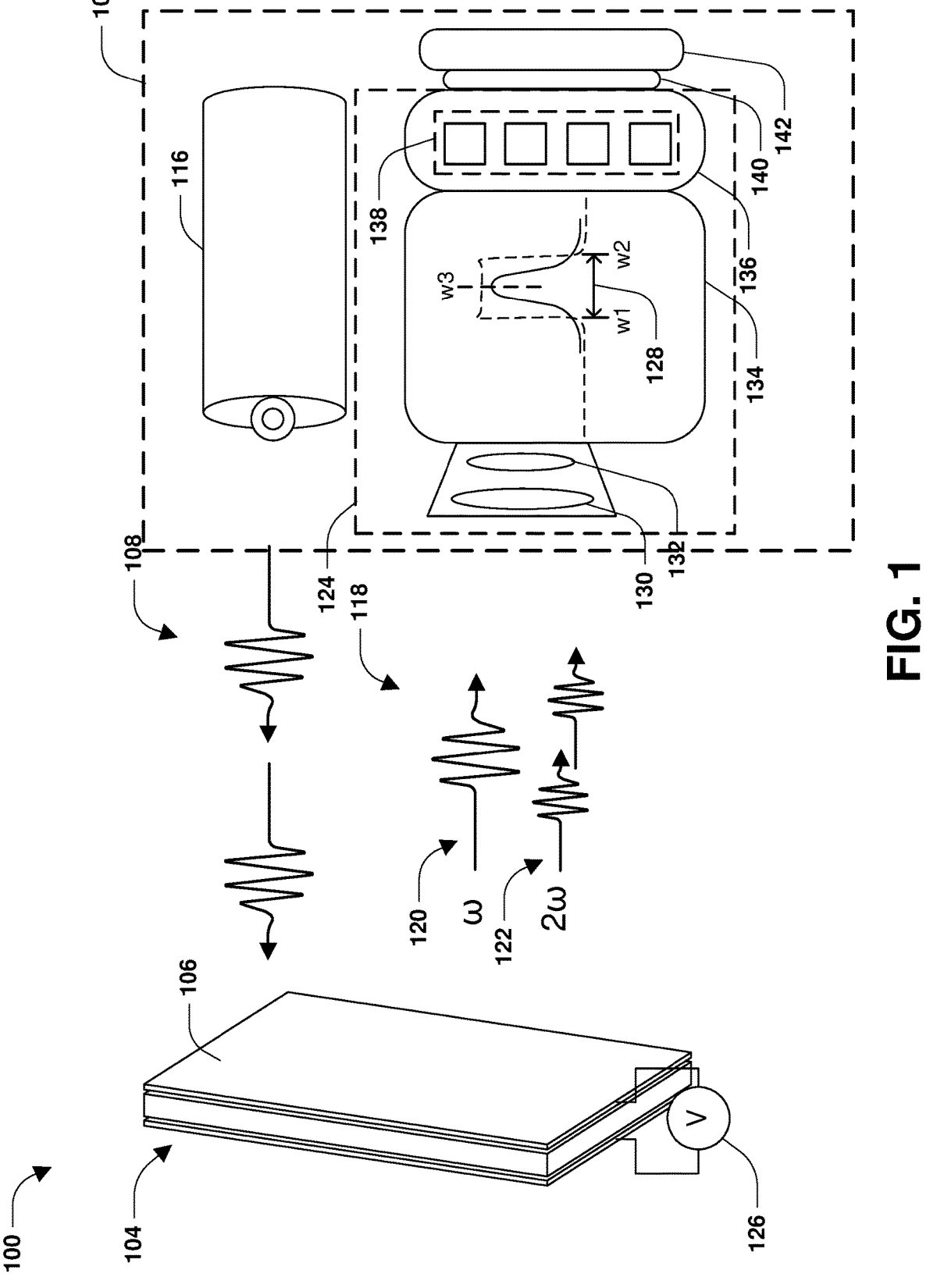
FIG. 1 a schematic view of a system, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to other element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

According to some embodiments, an apparatus has a laser generation device, a reflection detection device, and a computer. The laser generation device is configured to emit a laser signal to a semiconductor fabrication component. The reflection detection device is configured to receive a reflection signal comprising light, of the laser signal, reflected by a surface of the semiconductor fabrication component. The light of the laser signal being reflected by the surface generates one or more additional harmonics in the reflection signal, such as due, at least in part, by second harmonic generation that occurs when the laser signal is reflected by the surface. Accordingly, the reflection signal comprises first harmonic light having an original wavelength of the laser signal generated by the laser generation device and second harmonic light having a wavelength that is about half of the original wavelength. An intensity of the second harmonic light within the reflection signal is reflective of an electrostatic field strength at the surface of the semiconductor fabrication component. In some embodiments, an increase in the intensity of the second harmonic light is reflective of a higher value of the electrostatic field strength at the surface.

In some embodiments, the reflection detection device comprises an optical filter that that filters the reflection signal to provide filtered light, comprising the second harmonic light, to a light sensor. In some embodiments, the optical filter filters the reflection signal by blocking light, of the reflection signal, other than the second harmonic light. The light sensor generates an electrical signal based upon the filtered light. The electrical signal is indicative of an intensity of the filtered light. In some embodiments, the intensity of the filtered light is about equal to the intensity of the second harmonic light in the reflection signal, such as due, at least in part, to the light other than the second harmonic light being filtered out of the filtered light by the optical filter. The computer determines, based upon the electrical signal, measures of electrostatic field strength at the surface. In some embodiments, an electrostatic field strength map is generated based upon the measures of electrostatic field strength.

In some embodiments, the computer detects an electrostatic event at the semiconductor fabrication component using at least one of the electrostatic field strength map or the measures of electrostatic field strength. In some embodiments, the electrostatic event corresponds to at least one of an accumulation of electrostatic charge, an electrostatic field hotspot, or a potential electrostatic discharge (ESD) event at the semiconductor fabrication component. If the electrostatic event is not detected or addressed, the electrostatic event can cause damage to the semiconductor fabrication component by at least one of ESD, arcing, micro-arcing, or other event.

In some embodiments, the apparatus is configured to provide one or more signals indicative of at least one of the electrostatic field strength map, the measures of electrostatic field strength, or the detected electrostatic event. In some embodiments, based upon the one or more signals, one or more maintenance operations are performed to at least one of repair a component associated with the electrostatic event or remove electrostatic charge associated with the electrostatic event, thereby at least one of mitigating or preventing damage that could otherwise be caused by the electrostatic event. Accordingly, the electrostatic event is automatically detected without relying upon a technician to manually inspect semiconductor fabrication components in a facility to identify the electrostatic event, which may be dangerous, difficult, or even impossible for the technician to identify. In some embodiments, the one or more signals have at least one of an instruction to cease operation of equipment associated with the electrostatic event or an instruction to switch an operational mode of the equipment. Ceasing the operation of the equipment or switching the operational mode of the equipment can prevent the electrostatic event from causing damage to at least one of the equipment or surrounding equipment.

FIG. 1 illustrates a schematic view of a system 100, according to some embodiments. The system 100 comprises an apparatus 102 configured to determine measures of electrostatic field strength at a surface 106 of a component 104. In some embodiments, the component 104 comprises a semiconductor fabrication component, such as at least one of (i) physical vapor deposition (PVD) equipment, such as plasma enhanced PVD equipment, (ii) chemical vapor deposition (CVD) equipment, (iii) plating equipment, (iv) etching equipment, such as at least one of plasma etching equipment, wet etching equipment or dry etching equipment, (v) lithography equipment, (vi) chemical mechanical planarization (CMP) equipment, (vii) semiconductor wafer storage equipment, such as a front opening unified pod (FOUP), (viii) a component that utilizes plasma, (ix) a tube, such as at least one of a pipe, an insulated tube, or other type of tube that is configured to conduct fluid comprising at least one of liquid or gas, (x) a manifold, (xi) fluid storage equipment configured to store fluid comprising at least one of liquid or gas, (xii) a processing chamber, (xiii) a pump, (xiv) a robotic arm, (xv) one or more stocker tools, (xvi) one or more management tools, (xvii) one or more handling tools, (xviii) inspection equipment, (xix) an automated material handling system, (xx) an automated transport system, (xxi) a lorry tank, (xxii) a mask, (xxiii) a mask box, or (xxiv) other equipment. In some embodiments, a measure of electrostatic field strength determined by the apparatus 102 corresponds to at least one of a measure of electrostatic charge accumulation, a voltage level 126, an electrostatic field strength amplitude, or other measure.

In some embodiments, the apparatus 102 comprises a laser generation device 116 configured to emit a laser signal 108 to the component 104. In some embodiments, the laser generation device 116 comprises at least one of a laser diode, an injection laser diode, a light-emitting diode, or other device. The laser signal 108 comprises at least one of a series of laser pulses, or a continuous laser. In some embodiments, the laser generation device 116 performs laser scanning cycles in which the laser generation device 116 scans the laser signal 108 across the component 104 in at least one of a horizontal direction or a vertical direction. In some embodiments, in a scanning cycle performed using the laser generation device 116, the laser signal 108 impinges upon a plurality of points across the surface 106 of the component 104. A time duration of a scanning cycle performed by the laser generation device 116 is between about 1 microsecond to about 1 second. Other values of the time duration are within the scope of the present disclosure.

In some embodiments, the apparatus 102 comprises a reflection detection device 124 configured to receive a reflection signal 118 comprising light, of the laser signal 108, reflected by the surface 106 of the component 104. The reflection signal 118 comprises first harmonic light 120 "w" and second harmonic light 122 "2w". The second harmonic light 122 is generated via second-harmonic generation (also called frequency doubling) that occurs when the light of the laser signal 108 is reflected by the surface 106 of the component 104. As a result of the second-harmonic generation, two photons of the light of the laser signal 108 are combined to generate a new photon in the reflection signal 118 with about twice the energy of the two photons, about twice the frequency of the two photons, and about half the wavelength of the two photons. Thus, a wavelength of the second harmonic light 122 in the reflection signal 118 is about half of the wavelength of the first harmonic light 120 in the reflection signal 118.

In some embodiments, the reflection detection device 124 comprises at least one of a light sensor 136, an optical filter 134, or one or more lenses. The one or more lenses are configured to conduct the reflection signal 118 to the optical filter 134. In some embodiments, the one or more lenses comprise at least one of a focus lens 130, a polarized lens 132, or one or more other lenses. In some embodiments, the focus lens 130 is configured to channel light, which impinges upon the focus lens 130, towards at least one of the polarized lens 132 or the optical filter 134. In some embodiments, in comparison with embodiments without the focus lens 130, implementing the reflection detection device 124 with the focus lens 130 provides for more light of the reflection signal 118 reaching at least one of the optical filter 134 or the light sensor 136, thereby improving an accuracy of a signal generated by the light sensor 136. In some embodiments, the polarized lens 132 is configured to optically polarize photons of light impinging upon the polarized lens 132, and conduct polarized photons to the optical filter 134. In some embodiments, in comparison with embodiments without the polarized lens 132, implementing the reflection detection device 124 with the polarized lens 132 provides for a higher resolution of a signal generated by the light sensor 136.

In some embodiments, the optical filter 134 comprises at least one of a bandpass filter or other type of filter. The optical filter 134 is configured to block light that has a wavelength outside a defined range of wavelengths 128 and provide filtered light, from the reflection signal 118, that has a wavelength within the defined range of wavelengths 128. Accordingly, light having a wavelength outside the defined range of wavelengths 128 is at least one of absorbed, filtered, or not transmitted to the light sensor 136, whereas light having a wavelength within the defined range of wavelengths 128 passes through the optical filter 134 to the light sensor 136. The defined range of wavelengths 128 ranges from a first wavelength w1 to a second wavelength w2. Accordingly, light with a wavelength under the first wavelength w1 or over the second wavelength w2 is blocked by the optical filter 134.

In some embodiments, the defined range of wavelengths 128 comprises a third wavelength w3 equal to half of a laser signal wavelength of the laser signal 108 generated by the laser generation device 116. The laser signal wavelength of the laser signal 108 is equal to a wavelength of the first harmonic light 120 of the reflection signal 118. Accordingly, the second harmonic light 122, which has the third wavelength w3 equal to half of the laser signal wavelength, passes through the optical filter 134 to the light sensor 136.

In some embodiments, the second wavelength w2, corresponding to an upper limit of the defined range of wavelengths 128, is smaller than the laser signal wavelength. Accordingly, the first harmonic light 120 in the reflection signal 118 is blocked by the optical filter 134 and is not transmitted to the light sensor 136.

In some embodiments, the first wavelength w1, corresponding to a lower limit of the defined range of wavelengths 128, is larger than half of the third wavelength w3, such that the optical filter 134 blocks at least one of third harmonic light, fourth harmonic light, etc. within the reflection signal 118.

Thus, in accordance with some of the embodiments herein, the optical filter 134 provides the second harmonic light 122 to the light sensor 136 while blocking at least one of the first harmonic light 120 or other harmonics from reaching the light sensor 136. Other configurations of the optical filter 134 are within the scope of the present disclosure.

In an embodiment, the laser signal wavelength of the laser signal 108 is about 850 nanometers, and thus the third wavelength w3 of the second harmonic light 122 is about 425 nanometers. In some embodiments, the second wavelength w2, corresponding to the upper limit of the defined range of wavelengths 128, is equal to a value larger than 425 nanometers and smaller than 850 nanometers. In some embodiments, the first wavelength w1, corresponding to the lower limit of the defined range of wavelengths 128, is equal to a value larger than 212.5 nanometers and smaller than 425 nanometers. Other values of the laser signal wavelength, the first wavelength w1, the second wavelength w2, and the third wavelength w3 are within the scope of the present disclosure.

The light sensor 136 is configured to generate an electrical signal based upon the filtered light provided by the optical filter 134. In some embodiments, the electrical signal is indicative of a measure of intensity of the filtered light. In some embodiments, the measure of intensity of the filtered light corresponds to a measure of intensity of the second harmonic light 122, such as due, at least in part, to the filtered light comprising the second harmonic light 122 and light other than the second harmonic light 122 being filtered out of the filtered light by the optical filter 134. In some embodiments, the light sensor 136 comprises an array of photodiodes 138 comprising a plurality of photodiodes. A photodiode of the array of photodiodes 138 is configured to produce current of the electrical signal, wherein an amount of the current produced by the photodiode depends upon an amount of photons that reach the photodiode. The photons are at least one of sensed, detected, or converted to electrons by the photodiode. In some embodiments, the electrical signal generated by the light sensor 136 having at least one of a higher voltage or a higher current indicates a higher measure of intensity of the filtered light.

In some embodiments, the apparatus 102 comprises a computer 140 configured to determine, based upon the electrical signal generated by the light sensor 136, a plurality of measures of electrostatic field strength at the surface 106 of the component 104. In some embodiments, a measure of electrostatic field strength of the plurality of measures of electrostatic field strength corresponds to at least one of a measure of electrostatic charge accumulation, a voltage level, an electrostatic field strength amplitude, or other measure.

In some embodiments, the plurality of measures of electrostatic field strength are associated with a plurality of points or regions of the surface 106 of the component 104. A first measure of electrostatic field strength of the plurality of measures of electrostatic field strength is associated with a first point or region of the surface 106, and corresponds to at least one of a measure of electrostatic charge accumulation associated with the first point or region, a voltage level associated with the first point or region, an electrostatic field strength amplitude associated with the first point or region, or other measure associated with the first point or region. A second measure of electrostatic field strength of the plurality of measures of electrostatic field strength is associated with a second point or region of the surface 106, and corresponds to at least one of a measure of electrostatic charge accumulation associated with the second point or region, a voltage level associated with the second point or region, an electrostatic field strength amplitude associated with the second point or region, or other measure associated with the second point or region.

In some embodiments, the plurality of measures of electrostatic field strength are associated with a scanning cycle in which the laser generation device 116 scans the laser signal 108 across the plurality of points or regions of the surface 106 of the component 104. At least one of the first measure of electrostatic field strength is generated based upon a reflection of the laser signal 108 upon the first point or region during the scanning cycle, the second measure of electrostatic field strength is generated based upon a reflection of the laser signal 108 upon the second point or region during the scanning cycle, etc.

In some embodiments, the first measure of electrostatic field strength is generated based upon a first measure of intensity indicated by the electrical signal generated by the light sensor 136. The first measure of intensity is generated based upon filtered light filtered by the optical filter 134 from first light of the reflection signal 118, wherein the first light of the reflection signal 118 comprises light, of the laser signal 108, reflected by the first point or region of the surface 106 of the component 104. In some embodiments, the computer 140 performs one or more operations, such as one or more mathematical operations, using the first measure of intensity to determine the first measure of electrostatic field strength. The first measure of electrostatic field strength is a function of at least one of the first measure of intensity, a distance between the reflection detection device 124 and the first point or region of the surface 106, or other value.

In some embodiments, the second measure of electrostatic field strength is generated based upon a second measure of intensity indicated by the electrical signal generated by the light sensor 136. The second measure of intensity is generated based upon filtered light filtered by the optical filter 134 from second light of the reflection signal 118, wherein the second light of the reflection signal 118 comprises light, of the laser signal 108, reflected by the second point or region of the surface 106 of the component 104. In some embodiments, the computer 140 performs one or more operations, such as one or more mathematical operations, using the second measure of intensity to determine the second measure of electrostatic field strength. The second measure of electrostatic field strength is a function of at least one of the second measure of intensity, a distance between the reflection detection device 124 and the second point or region of the surface 106, or other value.

In some embodiments, the computer 140 generates an electrostatic field strength map based upon the plurality of measures of electrostatic field strength. The electrostatic field strength map is indicative of the plurality of measures of electrostatic field strength. In some embodiments, the electrostatic field strength map is indicative of the plurality of points or regions, of the surface 106 of the component 104, associated with the plurality of measures of electrostatic field strength. In some embodiments, the electrostatic field strength map comprises an array of values, wherein a value in the array is associated with a point or region of the surface 106 of the component 104, and is indicative of a measure of electrostatic field strength associated with the point or region. In some embodiments, a first value of the array of values is associated with the first point or region of the surface 106, and is indicative of the first measure of electrostatic field strength. A second value of the array of values is associated with the second point or region of the surface 106, and is indicative of the second measure of electrostatic field strength.

In some embodiments, the electrostatic field strength map comprises an electrostatic field strength image. In some embodiments, the electrostatic field strength image is indicative of the plurality of measures of electrostatic field strength, and the plurality of points or regions, of the surface 106 of the component 104, associated with the plurality of measures of electrostatic field strength. In some embodiments, the computer 140 comprises an image signal processor configured to generate the electrostatic field strength image. In some embodiments, the electrostatic field strength image is a color-coded image, where a color of a pixel of the electrostatic field strength image is indicative of a measure of electrostatic field strength associated with a point, of the surface 106 of the component 104, corresponding to the pixel.

In some embodiments, the computer 140 determines a plurality of pixel colors of the electrostatic field strength image based upon the plurality of measures of electrostatic field strength. In some embodiments, the computer 140 determines a first pixel color, of the plurality of pixel colors, based upon the first measure of electrostatic field strength associated with the first point or region. The computer 140 generates one or more first pixels, of the electrostatic field strength image, according to the first pixel color. At least one of a shade, tint, tone, color, etc. of the first pixel color is based upon the first measure of electrostatic field strength. The one or more first pixels of the electrostatic field strength image correspond to the first point or region of the surface 106.

In some embodiments, the computer 140 determines a second pixel color, of the plurality of pixel colors, based upon the second measure of electrostatic field strength associated with the second point or region. The computer 140 generates one or more second pixels, of the electrostatic field strength image, according to the second pixel color. At least one of a shade, tint, tone, color, etc. of the second pixel color is based upon the measure of electrostatic field strength. The one or more second pixels of the electrostatic field strength image correspond to the second point or region of the surface 106.

In some embodiments, if the first measure of electrostatic field strength is different than the second measure of electrostatic field strength, at least one of a shade, tint, tone, color, etc. of the first pixel color is different than at least one of a shade, tint, tone, color, etc. of the second pixel color. In an embodiment, at least one of a first range of measures of electrostatic field strength correspond to red, a second range of measures of electrostatic field strength correspond to blue, a third range of measures of electrostatic field strength correspond to purple, etc. In some embodiments, the first range of measures of electrostatic field strength are associated with varying shades, tints, tones, etc. of red, wherein a higher measure of electrostatic field strength in the first range corresponds to a darker or lighter shade, tint, tone, etc. of red than a lower measure of electrostatic field strength in the first range.

In some embodiments, the apparatus 102 comprises an image sensor configured to generate a visual image of the component 104. In some embodiments, the image sensor is part of the computer 140, or is separate from the computer 140. The image sensor comprises at least one of a charge coupled device (CCD) image sensor, a complementary metal oxide semiconductor (CMOS) image sensor, a contact image sensor (CIS), recording film, or other device. The image sensor generates the visual image to be a visual representation of the component 104. In some embodiments, the computer 140, such as the image signal processor of the computer 140, generates the electrostatic field strength image based upon the plurality of measures of electrostatic field strength and the visual image. In some embodiments, the computer 140 generates the electrostatic field strength image using the visual image and the plurality of pixel colors determined based upon the plurality of measures of electrostatic field strength, such as by combining the visual image with the plurality of pixel colors to generate the electrostatic field strength image. In some embodiments, the computer 140 modifies the visual image based upon the plurality of pixel colors to generate the electrostatic field strength image. In some embodiments, the electrostatic field strength image is a visual representation of the component 104 and the plurality of measures of electrostatic field strength.

In some embodiments, the apparatus 102 is positioned facing the component 104 such that the laser signal 108 is emitted towards the component 104. In some embodiments, the apparatus 102 is positioned at least one of level with the component 104, over the component 104, under the component 104, within the component 104, outside the component 104, within a threshold distance of the component 104, touching the component 104, etc. In some embodiments, at least one of during operation of the component 104, before the operation of the component 104, or after the operation of the component 104, the apparatus 102 determines measures of electrostatic field strength associated with the component 104, generates electrostatic field strength maps associated with the component 104, or detects one or more electrostatic events associated with the component 104. In some embodiments, the operation of the component 104 corresponds to a state of the component 104 in which the component 104 is actively used to perform one or more operations, such as at least one of conduct fluid through a tube, perform CVD, perform plasma CVD, perform high density plasma CVD, perform surface treatment, perform plasma surface treatment, perform implantation process, perform PVD, perform plasma enhanced PVD, perform etching, perform dry etching, perform wet etching, perform plasma etching, activate a robot arm, etc.

In some embodiments, the component 104 is used in a facility, such as an industrial facility, in which semiconductor devices are fabricated. In some embodiments, the component 104 is used to perform one or more semiconductor fabrication acts corresponding to at least a part of a semiconductor fabrication process performed to at least partially fabricate the semiconductor devices. In some embodiments, the one or more semiconductor fabrication acts correspond to at least one of front-end-of-line (FEOL) fabrication, back-end-of-line (BEOL) fabrication, semi-completed product fabrication, or other types of semiconductor fabrication. In some embodiments, the component 104 corresponds to equipment that directly processes the semiconductor devices. In some embodiments, the component 104 corresponds to equipment that manages at least one of a temperature, an air pressure, a humidity, etc. of the facility. In some embodiments, the component 104 corresponds to equipment, such as tubes, valves, manifolds, power lines, etc., that is configured to supply tools in the facility with resources comprising at least one of gas, liquid, heat, energy, etc., wherein the resources are used by the tools to perform semiconductor fabrication acts. In some embodiments, the semiconductor devices comprise at least one of transistors, gate-all-around field-effect-transistors (GAA FETs), metal-oxide-semiconductor field-effect-transistors (MOSFETs), fin field-effect-transistors (finFETs), two-dimensional (2D) devices, or other types of semiconductor devices.

In some embodiments, the apparatus 102 is in a fixed position, such as coupled to a fixed position mount. In some embodiments, the apparatus 102 is coupled to a mobile or portable device or vehicle. In some embodiments, the apparatus 102 is rotatable around an axis, such as coupled to a motor that automatically controls an angular position of the apparatus 102 with respect to the axis. In some embodiments, a scope for which the apparatus 102 at least one of determines the plurality of measures of electrostatic field strength or generates the electrostatic field strength map is adjustable. In some embodiments, increasing the scope corresponds to zooming-out such that at least one of the plurality of measures of electrostatic field strength or the electrostatic field strength map cover a larger area. In some embodiments, decreasing the scope corresponds to zooming-in such that at least one of the plurality of measures of electrostatic field strength or the electrostatic field strength map cover a smaller area.

Embodiments are contemplated in which at least some of the apparatus 102, such as at least one of the laser generation device 116 or the reflection detection device 124, is implemented in an inspection device that can be inserted through a cavity, such as in an endoscopy-like fashion. In some embodiments, the inspection device comprises merely some of the apparatus 102, and the inspection device is smaller than an implementation of the entirety of the apparatus 102 in a single package, and can thus be inserted through smaller openings and/or be positioned in smaller spaces than the single package. In some embodiments, the inspection device is positioned within the component 104, such as at least one of a process chamber, a valve manifold box, a tube, etc., such that at least one of measures of electrostatic field strength, electrostatic field strength maps, or electrostatic events are determined from within the component 104. Embodiments are contemplated in which the entirety of the apparatus 102 is implemented in a single package.

Figure 2C:
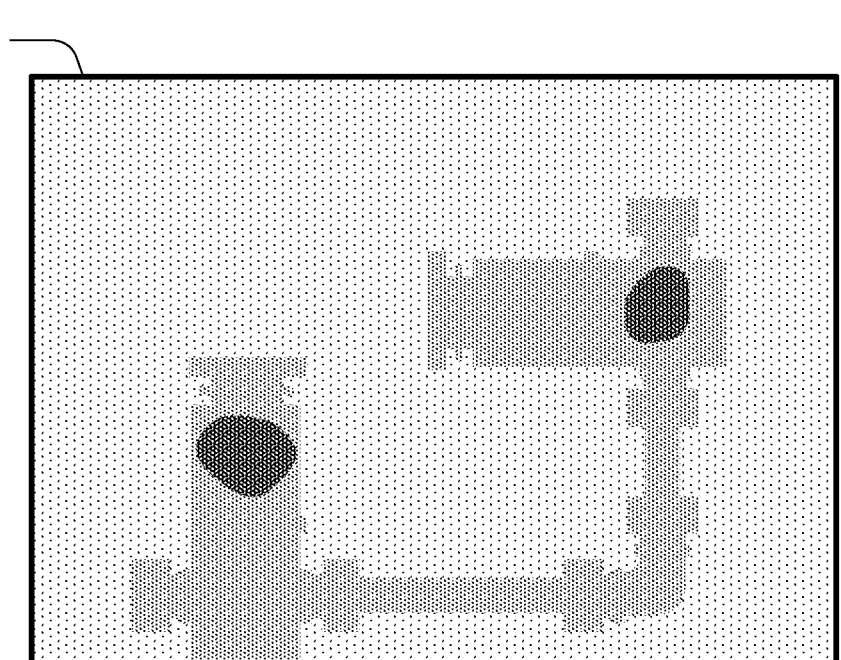
FIG. 2C illustrates a representation of a plurality of pixel colors determined based upon a plurality of measures of electrostatic field strength, in accordance with some embodiments.

FIGS. 2A-2D illustrate generation of the electrostatic field strength image using the apparatus 102, according to some embodiments in which the component 104 comprises a first valve 204, a second valve 206, and a tube 208, such as an insulated tube configured to conduct fluid 210 comprising at least one of liquid or gas. FIG. 2A illustrates a perspective view of the apparatus 102 and the component 104, according to some embodiments. In some embodiments, the apparatus 102 is positioned facing the component 104, and emits the laser signal 108 (shown in FIG. 1) towards the component 104. The first valve 204 is at least one of a manual valve, an automatic valve, or other type of valve. The second valve 206 is at least one of a manual valve, an automatic valve, or other type of valve. In some embodiments, the fluid 210 is conducted from the second valve 206, through the tube 208, to the first valve 204.

FIG. 2B illustrates the visual image (shown with reference number 220) of the component 104 generated using the image sensor of the apparatus 102, according to some embodiments. The visual image 220 comprises a visual representation of the component 104. FIG. 2C illustrates a representation 230 of the plurality of pixel colors determined based upon the plurality of measures of electrostatic field strength, according to some embodiments.

Figure 2D:
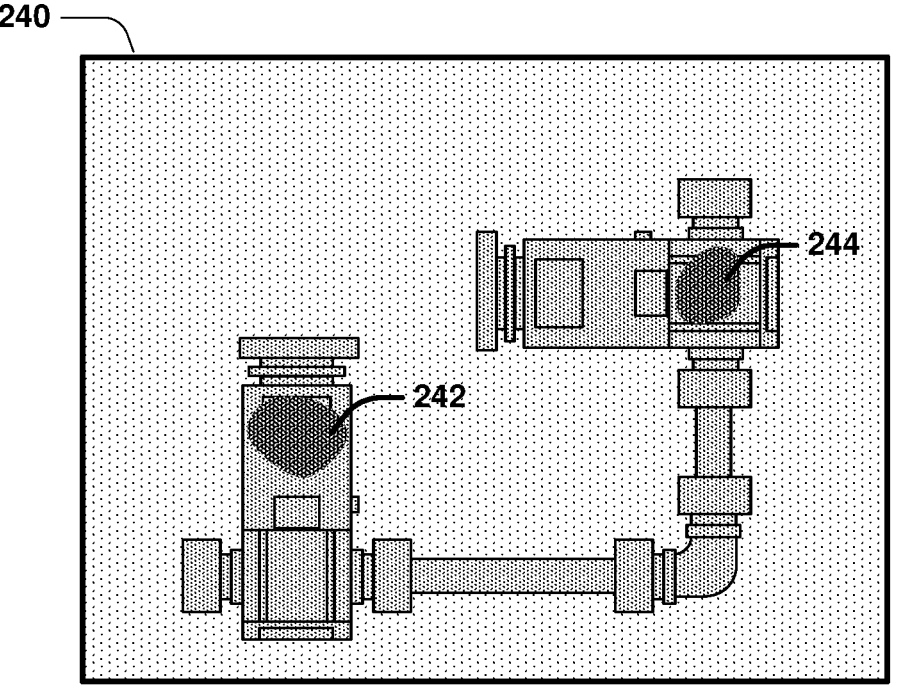
FIG. 2D illustrates an electrostatic field strength map generated by an apparatus, in accordance with some embodiments.

FIG. 2D illustrates the electrostatic field strength map generated by the apparatus 102, according to some embodiments in which the electrostatic field strength map comprises an electrostatic field strength image 240. In some embodiments, the computer 140 combines the visual image 220 (shown in FIG. 2B) with the representation 230 of the plurality of pixel colors (shown in FIG. 2C) to generate the electrostatic field strength image 240 (shown in FIG. 2D). In some embodiments, the computer 140 modifies the visual image 220, based upon the plurality of pixel colors, to generate the electrostatic field strength image 240. In some embodiments, the electrostatic field strength image 240 comprises a visual representation of the component 104 and the plurality of measures of electrostatic field strength.

In some embodiments, the electrostatic field strength image 240 (shown in FIG. 2D) is displayed via a display 142 (shown in FIG. 1) of the apparatus 102. In some embodiments, the computer 140 updates the display 142 to display an updated and/or current electrostatic field strength image. The computer 140 updates the display 142 at least one of periodically, continuously, or in response to generating an updated and/or current electrostatic field strength image based upon at least one of updated and/or current measures of electrostatic field strength or an updated and/or current visual image generated using the image sensor. In accordance with some embodiments, an electrostatic field strength image displayed via the display 142 is a real-time representation of measures of electrostatic field strength of the component 104. Embodiments are contemplated in which the display 142 is separate from the apparatus 102, and is controlled to display the electrostatic field strength image 240 at least one of wirelessly or over a physical connection.

In some embodiments, the computer 140 detects an electrostatic event based upon the plurality of measures of electrostatic field strength. In some embodiments, the electrostatic event is detected based upon the electrostatic field strength map, such as the electrostatic field strength image 240. In some embodiments, the electrostatic event corresponds to at least one of an accumulation of electrostatic charge, an electrostatic field hotspot, or a potential ESD event on the component 104. If the electrostatic event is not detected or addressed, the electrostatic event can cause damage to the component 104 by at least one of ESD, arcing, micro-arcing, or other event.

In some embodiments, the computer 140 detects the electrostatic event based upon a determination that one or more measures of electrostatic field strength, of the plurality of measures of electrostatic field strength, associated with one or more points or regions of the surface 106 of the component 104 exceed a threshold measure of electrostatic field strength. In some embodiments, the electrostatic event is determined to be associated with the one or more points or regions of the surface 106 of the component 104. In some embodiments, the computer 140 detects the electrostatic event based upon a determination that an area covered by the one or more points or regions exceeds a threshold size. In some embodiments, the one or more measures of electrostatic field strength exceeding the threshold measure of electrostatic field strength indicates an increased likelihood of an event occurring, at the one or more points or regions of the surface 106, that can cause damage to the component 104, such as at least one of ESD, arcing, micro-arcing, or other event.

In some embodiments, the computer 140 detects the electrostatic event based upon a determination that a change in electrostatic field strength, at one or more points or regions of the surface 106 of the component 104, exceeds a threshold change in electrostatic field strength. In some embodiments, the change in electrostatic field strength is determined based upon one or more first measures of electrostatic field strength, of the plurality of measures of electrostatic field strength, associated with the one or more points or regions of the surface 106 and one or more second measures of electrostatic field strength, associated with the one or more points or regions of the surface 106, previously determined by the apparatus 102. In some embodiments, the change in electrostatic field strength is determined based upon a difference between a measure of electrostatic field strength of the one or more first measures of electrostatic field strength and a measure of electrostatic field strength of the one or more second measures of electrostatic field strength. In some embodiments, the change in electrostatic field strength corresponds to an increase in electrostatic field strength at the one or more points or regions. In some embodiments, the change in electrostatic field strength exceeding the threshold change in electrostatic field strength indicates an increased likelihood of an event occurring, at the one or more points or regions of the surface 106, that can cause damage to the component 104, such as at least one of ESD, arcing, micro-arcing, or other event.

In some embodiments, the computer 140 detects the electrostatic event based upon a determination that one or more pixels, of the electrostatic field strength image 240, associated with one or more points or regions of the surface 106 of the component 104 are one or more colors of a defined set of colors associated with electrostatic events. In some embodiments, the electrostatic event is determined to be associated with the one or more points or regions of the surface 106 of the component 104. In some embodiments, the computer 140 detects the electrostatic event based upon at least one of a determination that the one or more pixels that are the one or more colors have a pixel density that exceeds a threshold pixel density or a determination that a quantity of the one or more pixels exceed a threshold quantity. In some embodiments, the one or more pixels at least one of being the one or more colors of the defined set of colors, having the pixel density that exceeds the threshold pixel density, or having the quantity that exceeds the threshold quantity indicates an increased likelihood of an event occurring, at the one or more points or regions of the surface 106, that can cause damage to the component 104, such as at least one of ESD, arcing, micro-arcing, or other event.

In some embodiments, the computer 140 detects the electrostatic event based upon identification of a change in pixel color of one or more pixels associated with one or more points or regions of the surface 106 of the component 104. In some embodiments, the change in pixel color of the one or more pixels is determined by comparing the electrostatic field strength image 240 and a second electrostatic field strength image previously generated by the apparatus 102. In some embodiments, based upon the one or more pixels associated with the change in pixel color, the electrostatic event is determined to be associated with the one or more points or regions of the surface 106 of the component 104. In some embodiments, the one or more pixels associated with the one or more points or regions undergoing the change in pixel color from the second electrostatic field strength image to the electrostatic field strength image 240 indicates an increased likelihood of an event occurring, at the one or more points or regions of the surface 106, that can cause damage to the component 104, such as at least one of ESD, arcing, micro-arcing, or other event.

In some embodiments, the computer 140 detects the electrostatic event based upon a pattern in the electrostatic field strength image 240, such as a pattern of pixels. In some embodiments, the electrostatic field strength image 240 is analyzed to identify the pattern. In some embodiments, the pattern corresponds to a set of pixels in the electrostatic field strength image 240. In some embodiments, the electrostatic event is detected based upon the pattern matching a defined pattern of pixels associated with electrostatic events. In some embodiments, the pattern is compared with a plurality of defined patterns of pixels associated with electrostatic events to determine that the pattern matches the defined pattern of pixels. In some embodiments, comparing the pattern with the defined pattern of pixels comprises determining a similarity score representative of a similarity, such as a visual similarity, between the pattern and the defined pattern of pixels. In some embodiments, the pattern is determined to match the defined pattern of pixels based upon a determination that the similarity score exceeds a threshold similarity score. In some embodiments, the pattern matching the defined pattern of pixels indicates an increased likelihood of an event occurring, at the one or more points or regions of the surface 106 corresponding to the set of pixels of the pattern, that can cause damage to the component 104, such as at least one of ESD, arcing, micro-arcing, or other event.

In some embodiments, electrostatic field strength maps generated by the apparatus 102 are monitored, such as monitored in real-time as the electrostatic field strength maps are generated, to detect the electrostatic event. In some embodiments, the computer 140 detects the electrostatic event based upon detection of an anomalous event. In some embodiments, one or more patterns of electrostatic field strength behavior are identified by monitoring the electrostatic field strength maps. In some embodiments, the one or more patterns are identified by performing pattern recognition. In some embodiments, the one or more patterns correspond to temporal patterns of electrostatic field strength over time that result from operation, such as typical operation, of the component 104. In some embodiments, the anomalous event is detected based upon identifying a deviation from the one or more patterns. In some embodiments, the deviation from the one or more patterns is associated with one or more points or regions of the surface 106. In some embodiments, the anomalous event indicates an increased likelihood of an event occurring, at the one or more points or regions of the surface 106 associated with the anomalous event, that can cause damage to the component 104, such as at least one of ESD, arcing, micro-arcing, or other event In some embodiments, the computer 140 detects the electrostatic event using a trained machine learning model. In some embodiments, the trained machine learning model is trained using training information comprising electrostatic field strength maps, such as electrostatic field strength images, generated over a period of time. In some embodiments, the electrostatic field strength maps are retrieved from an electrostatic field strength map datastore used to store generated electrostatic field strength maps. In some embodiments, the electrostatic field strength maps are generated by the apparatus 102. In some embodiments, the electrostatic field strength maps are generated in association with at least one of the component 104 or one or more other components, such as where the electrostatic field strength maps are generated based upon electrostatic field strength measures, determined during the period of time, of at least one of the component 104 or the one or more other components. In some embodiments, the trained machine learning model comprises at least one of an artificial neural network, an artificial intelligence model, a pattern recognition model, a tree-based model, a machine learning model used to perform linear regression, a machine learning model used to perform logistic regression, a decision tree model, a support vector machine (SVM), a Bayesian network model, a k-Nearest Neighbors (k-NN) model, a K-Means model, a random forest model, a machine learning model used to perform dimensional reduction, a machine learning model used to perform gradient boosting, or other machine learning model. In some embodiments, the trained machine learning model is trained to perform electrostatic event detection to detect electrostatic events. In some embodiments, the trained machine learning model performs anomalous event detection to identify anomalous electrostatic field strength events considered to be electrostatic events. In some embodiments, the trained machine learning model performs pattern recognition to identify one or more patterns of measures of electrostatic field strength that result from operation, such as typical operation, of the component 104, and detects one or more electrostatic events by identifying a deviation from the one or more patterns. In some embodiments, the trained machine learning model is updated, such as updated periodically or continuously, using newly generated electrostatic field strength maps. In some embodiments, electrostatic field strength maps generated by the apparatus 102 are used to update the trained machine learning model in real-time as the electrostatic field strength maps are generated. In some embodiments, training and/or updating the trained machine learning model comprises adjusting trainable parameters of the trained machine learning model to increase an accuracy of electrostatic event detection performed using the trained machine learning model.

FIG. 2D illustrates a first electrostatic event 242 and a second electrostatic event 244 detected by the computer 140, according to some embodiments. In some embodiments, the first electrostatic event 242 is detected based upon one or more pixels associated with one or more points or regions corresponding to the first valve 204 (shown in FIG. 2A). In some embodiments, the first electrostatic event 242 is detected based upon a determination that the one or more pixels are one or more colors of the defined set of colors associated with electrostatic events. In some embodiments, the first electrostatic event 242 is detected based upon a determination that the one or more pixels are indicative of measures of electrostatic field strength that exceed the threshold measure of electrostatic field strength. In some embodiments, the first electrostatic event 242 is detected based upon a determination that a change in pixel color over time, of the one or more pixels, is indicative of a change in electrostatic field strength that exceeds the threshold change in electrostatic field strength. In some embodiments, the first electrostatic event 242 is detected using the trained machine learning model. In some embodiments, the first electrostatic event 242 is a result of the fluid 210 (shown in FIG. 2A), such as high resistance fluid, flowing through at least one of the tube 208 or the first valve 204 and introducing electrostatic charge to the first valve 204.

Figure 3A:
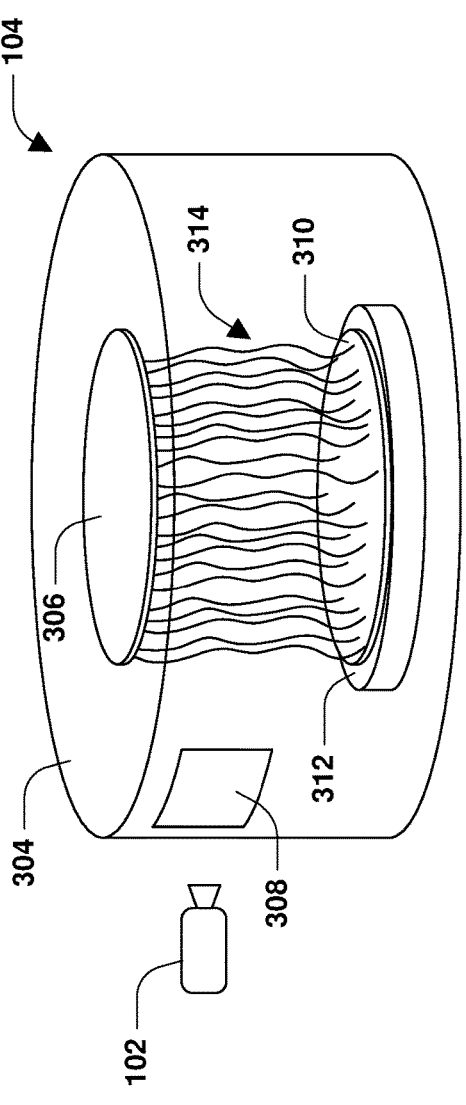
FIG. 3A illustrates a perspective view of an apparatus and a component, in accordance with some embodiments.

FIG. 3A illustrates a perspective view of the apparatus 102 and the component 104, according to some embodiments. In some embodiments, the component 104 comprises at least a portion of semiconductor processing equipment. The semiconductor processing equipment comprises at least one of a semiconductor processing chamber 304, a semiconductor wafer 310 (e.g., substrate, die, etc. and/or device (e.g., transistor, diode, etc.) formed therein, thereon, therefrom, etc. comprising semiconductor and/or other material (s)), a target 306, a wafer support 312, or one or more other components. In some embodiments, the semiconductor wafer 310 and/or one or more other components are merely associated with the semiconductor processing equipment and thus are not necessarily part of the semiconductor processing equipment (e.g., are merely placed within the semiconductor processing equipment to be processed). In some embodiments, the semiconductor processing equipment comprises PVD equipment, CVD equipment, plating equipment, etching equipment, lithography equipment, CMP equipment, equipment that utilizes plasma 314, or other equipment used to process the semiconductor wafer 310 in the semiconductor processing chamber 304. In some embodiments, the apparatus 102 is positioned outside the semiconductor processing chamber 304, and utilizes a window 308 in an outer wall of the semiconductor processing chamber 304 to generate electrostatic field strength maps associated with electrostatic field strength measurements of an interior of the semiconductor processing chamber 304, thereby enabling the apparatus 102 to detect one or more electrostatic events within the semiconductor processing chamber 304. In some embodiments, the one or more electrostatic events comprise an electrostatic event caused by the plasma 314, such as high-density plasma. In some embodiments, the window 308 is an opening, or is made of a material, such as a transparent material, through which the laser signal 108 and the reflection signal 118 can pass. Embodiments are contemplated in which the apparatus 102 generates electrostatic field strength maps associated with electrostatic field strength measurements of an exterior of the semiconductor processing chamber 304, such as the outer wall of the semiconductor processing chamber 304, thereby enabling the apparatus 102 to detect one or more electrostatic events at the exterior of the semiconductor processing chamber 304.

Figure 3B:
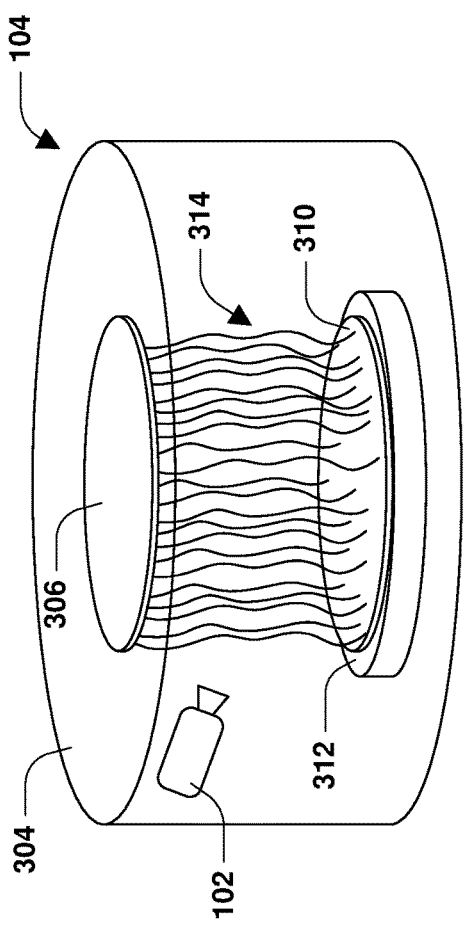
FIG. 3B illustrates a perspective view of an apparatus and a component, in accordance with some embodiments.

FIG. 3B illustrates a perspective view of the apparatus 102 and the component 104 comprising at least a portion of the semiconductor processing equipment, according to some embodiments in which the apparatus 102 is positioned inside the semiconductor processing chamber 304. Accordingly, the apparatus 102 generates electrostatic field strength maps associated with electrostatic field strength measurements of the interior of the semiconductor processing chamber 304, thereby enabling the apparatus 102 to detect one or more electrostatic events within the semiconductor processing chamber 304.

Figure 4A:
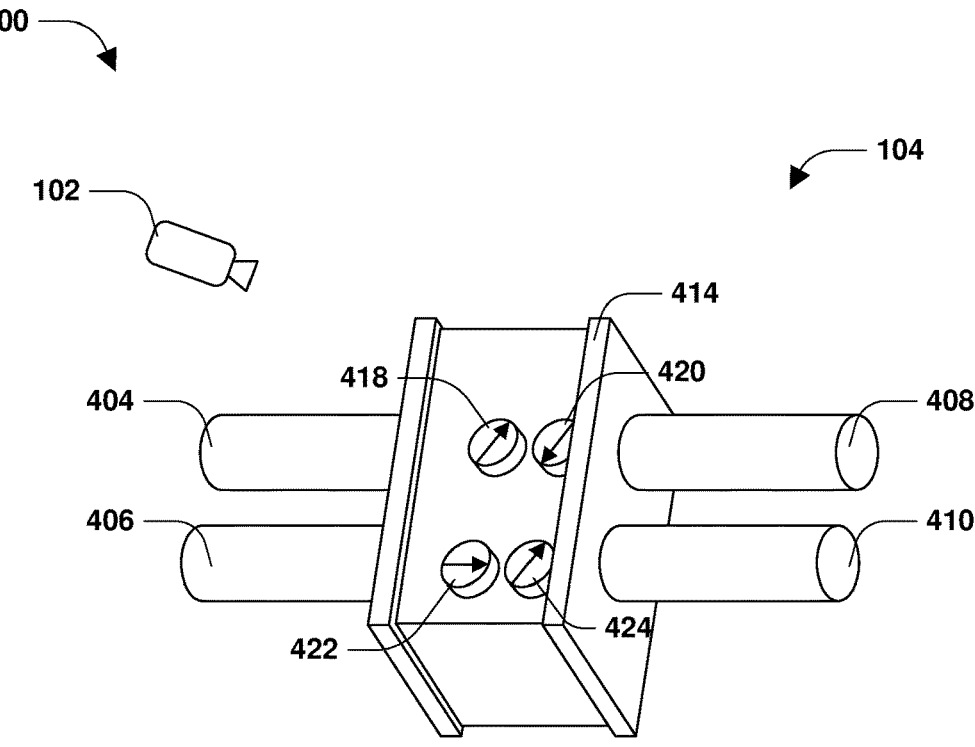
FIG. 4A illustrates a perspective view of an apparatus and a component, in accordance with some embodiments.
Figure 4B:
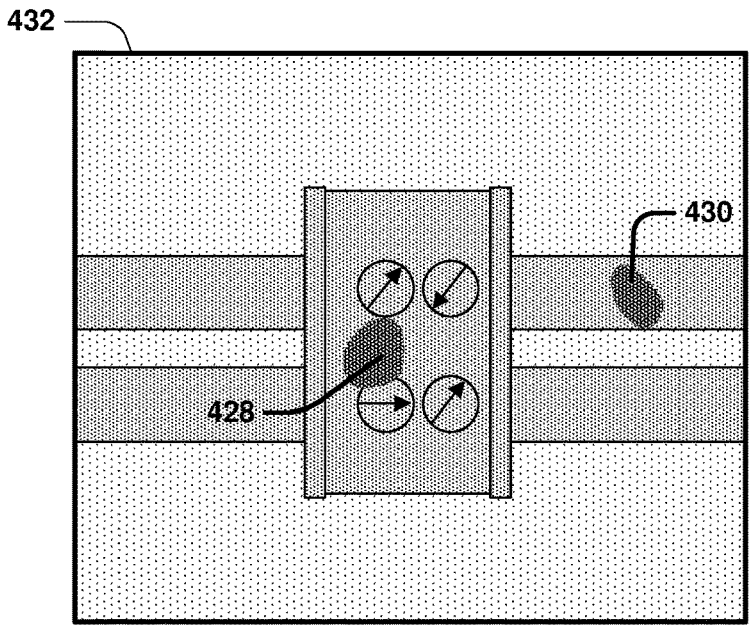
FIG. 4B illustrates an electrostatic field strength map generated by an apparatus, in accordance with some embodiments.

FIGS. 4A-4B illustrate operation of the apparatus 102, according to some embodiments in which the component 104 comprises at least one of a valve manifold box 414 or one or more tubes coupled to the valve manifold box 414. FIG. 4A illustrates a perspective view of the apparatus 102 and the component 104, according to some embodiments. In some embodiments, the apparatus 102 is positioned facing the component 104. In some embodiments, the valve manifold box 414 is configured to distribute, using the one or more tubes, fluid from a source to one or more tools. In some embodiments, the tools use the fluid, comprising at least one of gas or liquid, for fabricating semiconductor devices. In some embodiments, the one or more tubes comprise at least one of a tube 404, a tube 406, a tube 408, or a tube 410. In some embodiments, the valve manifold box 414 comprises one or more gauges to display measurements, such as pressure measurements, associated with at least one of valves or tubes that are within or coupled to the valve manifold box 414. The one or more gauges comprise at least one of a gauge 418, a gauge 420, a gauge 422, or a gauge 424.

FIG. 4B illustrates an electrostatic field strength image 432 generated by the apparatus 102, according to some embodiments. In some embodiments, the electrostatic field strength image 432 is generated using measures of electrostatic field strength across points or regions of the component 104 comprising at least one of the valve manifold box 414 or the one or more tubes, such as using one or more of the techniques shown in and/or described with respect to FIGS. 2A-2D. In some embodiments, the electrostatic field strength image 240 is a visual representation of the component 104 and the plurality of measures of electrostatic field strength.

A third electrostatic event 428 and a fourth electrostatic event 430 are detected by the computer 140, according to some embodiments. In some embodiments, the third electrostatic event 428 is detected based upon one or more pixels associated with one or more points or regions corresponding to the valve manifold box 414 (shown in FIG. 4A). In some embodiments, the third electrostatic event 428 is detected based upon a determination that the one or more pixels are one or more colors of the defined set of colors associated with electrostatic events. In some embodiments, the third electrostatic event 428 is detected based upon a determination that the one or more pixels are indicative of measures of electrostatic field strength that exceed the threshold measure of electrostatic field strength. In some embodiments, the third electrostatic event 428 is detected based upon a determination that a change in pixel color over time, of the one or more pixels, is indicative of a change in electrostatic field strength that exceeds the threshold change in electrostatic field strength. In some embodiments, the third electrostatic event 428 is detected using the trained machine learning model. In some embodiments, at least one of the third electrostatic event 428 or the fourth electrostatic event 430 is a result of fluid, such as high resistance fluid, flowing through the valve manifold box 414.

Figure 5:
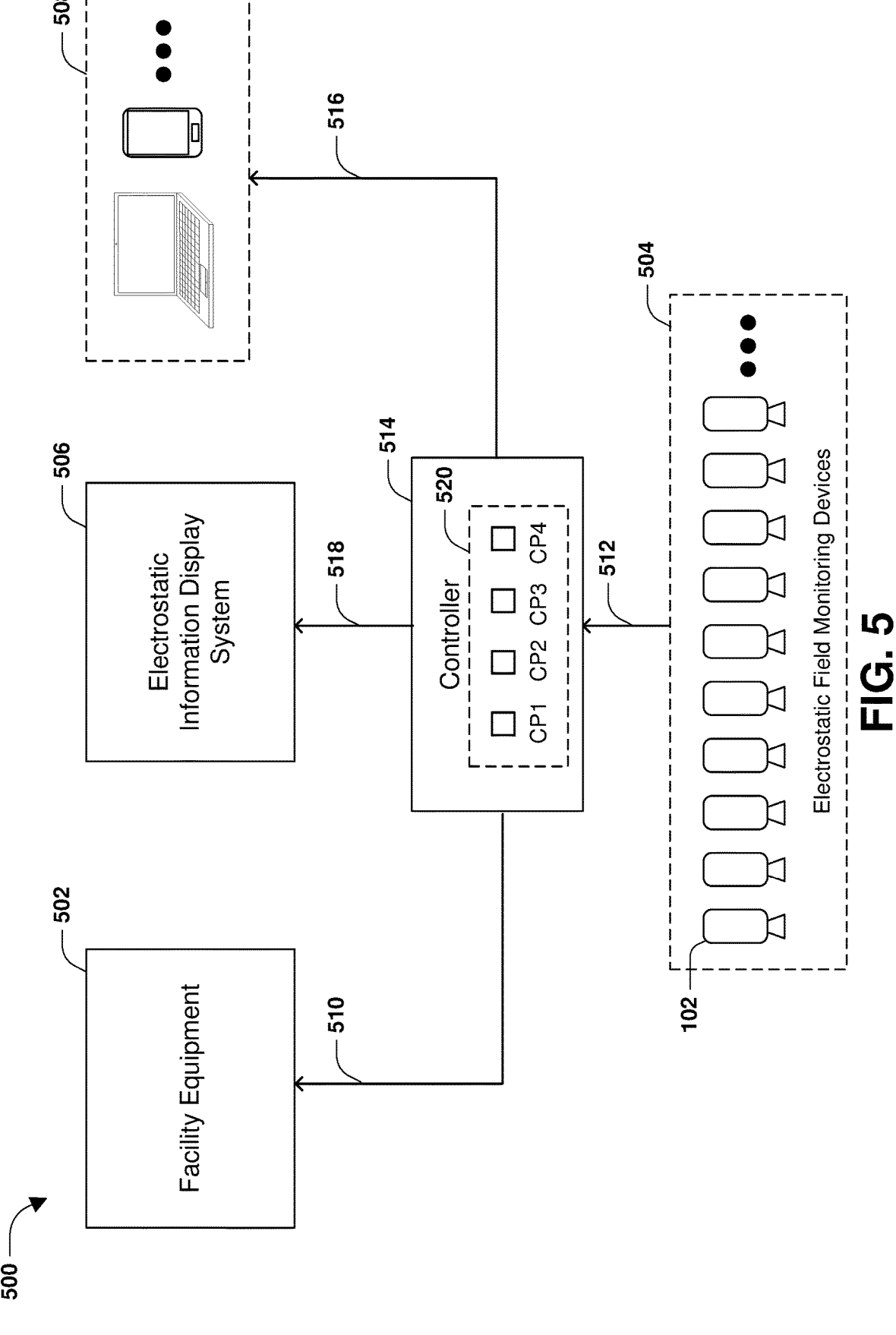
FIG. 5 illustrates a schematic view of a system, in accordance with some embodiments.

FIG. 5 illustrates a schematic view of a system 500 according to some embodiments. The system 500 comprises at least one of a set of electrostatic field monitoring devices 504 comprising the apparatus 102, facility equipment 502 of a facility, a controller 514, an electrostatic information display system 506, or one or more client devices 508. The set of electrostatic field monitoring devices 504 comprises electrostatic field monitoring devices distributed at various locations of the facility. The electrostatic field monitoring devices are used to perform electrostatic field strength measurements of a plurality of components, such as semiconductor fabrication components, throughout the facility. The plurality of components comprise at least one of (i) one or more components comprising PVD equipment, such as plasma enhanced PVD equipment, (ii) one or more components comprising CVD equipment, (iii) one or more components comprising plating equipment, (iv) one or more components comprising etching equipment, (v) one or more components comprising lithography equipment, (vi) one or more components comprising CMP equipment, (vii) one or more components comprising semiconductor wafer storage equipment, such as one or more FOUPs, (viii) one or more components that that utilize plasma, (ix) one or more components comprising one or more tubes, such as one or more pipes or one or more other type of tubes that are configured to conduct at least one of liquid or gas, (x) one or more manifolds, (xi) one or more components comprising fluid storage equipment, (xii) one or more processing chambers, (xiii) one or more pumps, (xiv) one or more robotic arms, (xv) one or more stocker tools, (xvi) one or more management tools, (xvii) one or more handling tools, (xviii) inspection equipment, (xix) one or more components of an automated material handling system, (xx) one or more components of an automated transport system, (xxi) a lorry tank, (xxii) one or more masks, (xxiii) one or more mask boxes, or (xxiv) one or more other components.

In some embodiments, the set of electrostatic field monitoring devices 504 transmit a set of electrostatic field signals 512 to the controller 514. In some embodiments, each signal of the set of electrostatic field signals 512 is transmitted by an electrostatic field monitoring device of the set of electrostatic field monitoring devices 504. In some embodiments, a first electrostatic field signal of the set of electrostatic field signals 512 is provided by a first electrostatic field monitoring device of the set of electrostatic field monitoring devices 504, a second electrostatic field signal of the set of electrostatic field signals 512 is provided by a second electrostatic field monitoring device of the set of electrostatic field monitoring devices 504, etc.

In some embodiments, the first electrostatic field monitoring device is positioned at least one of proximate a first component of the plurality of components or facing the first component, and is configured to at least one of (i) determine measures of electrostatic field strength associated with the first component, (ii) generate electrostatic field strength maps associated with the first component, or (iii) detect electrostatic events associated with the first component. In some embodiments, the first electrostatic field signal is indicative of at least one of the measures of electrostatic field strength associated with the first component or the electrostatic field strength maps associated with the first component. In some embodiments, in response to the first electrostatic field monitoring device detecting an electrostatic event, the first electrostatic field monitoring device includes an indication of the electrostatic event in the first electrostatic field signal, thereby informing the controller 514 of the electrostatic event.

In some embodiments, the second electrostatic field monitoring device is positioned at least one of proximate a second component of the plurality of components or facing the second component, and is configured to at least one of (i)

determine measures of electrostatic field strength associated with the second component, (ii) generate electrostatic field strength maps associated with the second component, or (iii) detect electrostatic events associated with the second component. In some embodiments, the second electrostatic field signal is indicative of at least one of the measures of electrostatic field strength associated with the second component or the electrostatic field strength maps associated with the second component. In some embodiments, in response to the second electrostatic field monitoring device detecting an electrostatic event, the second electrostatic field monitoring device includes an indication of the electrostatic event in the second electrostatic field signal, thereby informing the controller 514 of the electrostatic event.

Thus, in accordance with some embodiments, the set of electrostatic field monitoring devices 504 determine electrostatic field strength information associated with the plurality of components throughout the facility, and provide the electrostatic field strength information to the controller 514 via the set of electrostatic field signals 512. In some embodiments, the electrostatic field strength information of the set of electrostatic field signals 512 is indicative of one or more electrostatic events detected by one or more electrostatic field monitoring devices of the set of electrostatic field monitoring devices 504. In some embodiments, instead of the one or more electrostatic events being detected by the set of electrostatic field monitoring devices 504, the set of electrostatic field signals 512 provided by the set of electrostatic field monitoring devices 504 are indicative of at least one of measures of electrostatic field strength or electrostatic field strength maps associated with the plurality of components, wherein the at least one of the measures of electrostatic field strength or the electrostatic field strength maps are analyzed by the controller 514 to detect the one or more electrostatic events.

In some embodiments, the controller 514 comprises a set of status indicators 520 associated with components of the plurality of components of the facility. In some embodiments, an indicator of the set of status indicators 520 comprises a light, such as indicator light, that indicates whether or not an electrostatic event at a component in the facility is detected, wherein the light being in a first state indicates that an electrostatic event at the component is detected and/or the light being in a second state indicates that an electrostatic event at the component is not detected. In some embodiments, the first state corresponds to a first color emitted by the light, such as red or other color, and the second state corresponds to a second color emitted by the light, such as green or other color. The set of status indicators comprises at least one of a first indicator "CP1" associated with the first component, a second indicator "CP2" associated with the second component, a third indicator "CP3" associated with a third component of the plurality of components, a fourth indicator "CP4" associated with a fourth component of the plurality of components, or other indicator.

In some embodiments, the controller 514 determines electrostatic status information associated with the plurality of components of the facility. The electrostatic status information indicates at least one of whether or not an electrostatic event at a component of the plurality of components is detected, one or more components of the plurality of components associated with one or more detected electrostatic events, or other information.

In some embodiments, the controller 514 provides one or more first signals 510 to the facility equipment 502. In some embodiments, the one or more first signals 510 are used to control at least some of the facility equipment 502, such as one, some, and/or all of the plurality of components of the facility. In some embodiments, the one or more first signals 510 are generated using a signal generator of the controller 514. The one or more first signals 510 are indicative of at least one of the electrostatic status information or other information. In some embodiments, the controller 514 transmits the one or more first signals 510 to the facility equipment 502 wirelessly, such as using a wireless communication device of the controller 514. In some embodiments, the controller 514 transmits the one or more first signals 510 to the facility equipment 502 over a physical connection between the controller 514 and the facility equipment 502.

In some embodiments, the controller 514 transmits a second signal 518 to the electrostatic information display system 506. The second signal 518 is generated using the signal generator of the controller 514. In some embodiments, the second signal 518 is indicative of one or more electrostatic field strength maps, such as one or more electrostatic field strength images, generated using electrostatic field monitoring devices of the set of electrostatic field monitoring devices 504. In some embodiments, the second signal 518 is indicative of one or more detected electrostatic events. In some embodiments, the controller 514 transmits the second signal 518 to the electrostatic information display system 506 wirelessly, such as using the wireless communication device of the controller 514. In some embodiments, the controller 514 transmits the second signal 518 to the electrostatic information display system 506 over a physical connection between the controller 514 and the electrostatic information display system 506.

Figure 6:
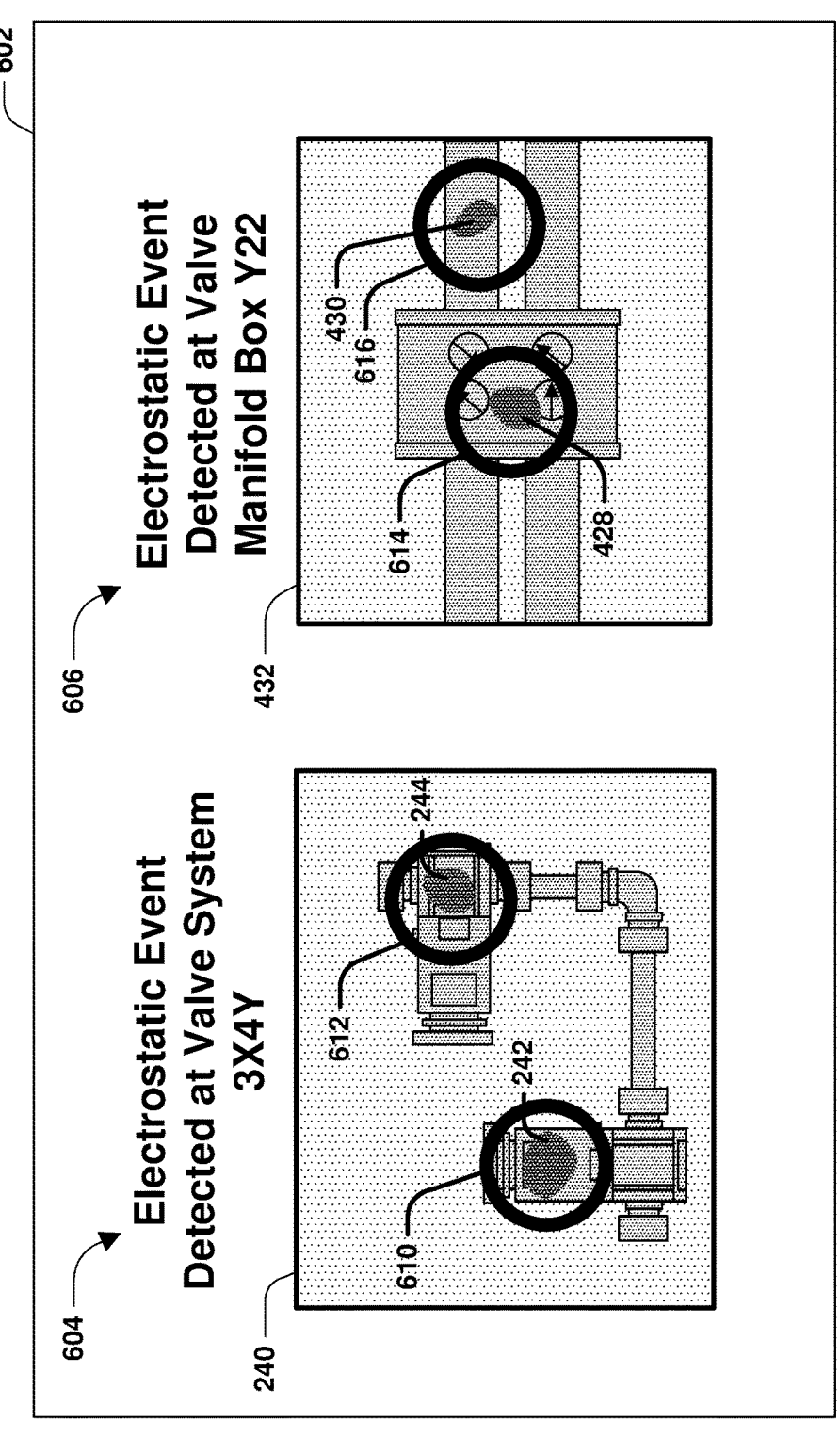
FIG. 6 illustrates an electrostatic information display system displaying electrostatic event information, in accordance with some embodiments.

FIG. 6 illustrates the electrostatic information display system 506 displaying information, according to some embodiments. In some embodiments, a display 602 of the electrostatic information display system 560 is controlled to display at least one of one or more electrostatic field strength maps, one or more electrostatic field strength measures, alerts of one or more detected electrostatic events, etc.

In some embodiments, the display 602 displays a first alert 604 associated with the first electrostatic event 242 and the second electrostatic event 244 associated with at least one of the first valve 204, the second valve 206, or the tube 208 (shown in FIG. 2A). In some embodiments, the first alert 604 comprises information "Valve System 3X4Y" that identifies where the first electrostatic event 242 and the second electrostatic event 244 are located. In some embodiments, the first alert 604 comprises a representation of the electrostatic field strength image 240. In some embodiments, the representation of the electrostatic field strength image 240 comprises indications 610 and 612 that overlay the electrostatic field strength image 240 and identify regions corresponding to the first electrostatic event 242 and the second electrostatic event 244.

In some embodiments, the display 602 displays a second alert 606 associated with the third electrostatic event 428 and the fourth electrostatic event 430 associated with the valve manifold box 414 (shown in FIG. 4A). In some embodiments, the second alert 606 comprises information "Valve Manifold Box Y22" that identifies where the third electrostatic event 428 and the fourth electrostatic event 430 are located. In some embodiments, the second alert 606 comprises a representation of the electrostatic field strength image 432. In some embodiments, the representation of the electrostatic field strength image 432 comprises indications 614 and 616 that overlay the electrostatic field strength image 432 and identify regions corresponding to the third electrostatic event 428 and the fourth electrostatic event 430.

Thus, in accordance with some embodiments, in response to detection of an electrostatic event in the facility, the electrostatic information display system 506 automatically alerts a viewer of the display 602 of the electrostatic event and where the electrostatic event is located, thereby enabling the viewer to address the electrostatic event before the electrostatic event causes damage to one or more components in the facility by at least one of ESD, arcing, micro-arcing, or other event.

In some embodiments, the controller 514 (shown in FIG. 5) transmits a third signal 516 to one or more client devices 508. The one or more client devices 508 comprise at least one of a phone, a smartphone, a mobile phone, a landline, a laptop, a desktop computer, hardware, or other type of client device. The third signal 516 is generated using the signal generator of the controller 514. In some embodiments, the third signal 516 is indicative of one or more electrostatic field strength maps, such as one or more electrostatic field strength images, generated using electrostatic field monitoring devices of the set of electrostatic field monitoring devices 504. In some embodiments, the third signal 516 is indicative of one or more detected electrostatic events. In some embodiments, the controller 514 transmits the third signal 516 to a client device of the one or more client devices 508 wirelessly, such as using the wireless communication device of the controller 514. In some embodiments, the controller 514 transmits the third signal 516 to a client device of the one or more client devices 508 over a physical connection between the controller 514 and the client device. In some embodiments, a client device of the one or more client devices 508 triggers an alarm based upon the third signal 516. In some embodiments, the client device triggers the alarm based upon the third signal 516 indicating that an electrostatic event is detected in the facility. In some embodiments, in response to triggering the alarm, an alarm message is displayed via the client device. The alarm message comprises at least one of an indication that an electrostatic event is detected in the facility, one or more indications of one or more components of the facility at which an electrostatic event is detected, or other indication. In some embodiments, an alarm sound is output via a speaker connected to the client device in response to triggering the alarm. In some embodiments, the third signal 516 comprises a message, such as at least one of an email, a text message, etc., transmitted in response to detecting an electrostatic event in the facility. In some embodiments, in response to detecting an electrostatic event in the facility, a telephonic call is made to a client device, such as a landline or a mobile phone, of the one or more client devices 508, such as using a dialer of the controller 514.

In some embodiments, the set of electrostatic field signals 512 are used as feedback based upon which operation of the facility equipment 502 is controlled by the controller 514. In some embodiments, the controller 514 controls operation of the facility equipment 502 based upon at least one of the electrostatic status information associated with the plurality of components of the facility, one or more detected electrostatic events, or other information. In some embodiments, operation of the facility equipment 502 is controlled using the one or more first signals 510. In some embodiments, a signal of the one or more first signals 510 is indicative of one or more instructions.

In some embodiments, equipment of the facility equipment 502 ceases operation based upon a signal of the one or more first signals 510, received by the equipment, at least one of indicating that an electrostatic event is detected at a component associated with the equipment or indicating an instruction to cease the operation of the equipment. In some embodiments, the signal indicates the instruction to cease the operation of the equipment based upon a determination, by the controller 514, that an electrostatic event is detected at the component associated with the equipment. In some embodiments, the component is at least one of connected to or a part of the equipment that ceases operation. In some embodiments, ceasing operation of the equipment comprises at least one of powering off one or more components of the equipment, disconnecting a power supply from one or more components of the equipment, the equipment entering a mode in which the equipment does not perform one or more operations, or other action.

In some embodiments, the equipment transfers from a first mode to a second mode based upon the signal at least one of indicating that an electrostatic event is detected or indicating an instruction to transfer from the first mode to the second mode. In some embodiments, the first mode is a mode in which the equipment performs one or more first operations and the second mode is a mode in which the equipment performs one or more second operations different than the one or more first operations. In some embodiments, the first mode is a mode in which at least one of a component of the equipment is unlocked or access to the component is not blocked and the second mode is a mode in which at least one of the component is locked or access to the component is blocked. In some embodiments, the first mode is a mode in which at least one of one or more functions of the equipment are enabled or initiation of a new process using the one or more functions is not blocked and the second mode is a mode in which at least one of the one or more functions of the equipment are disabled or initiation of a new process using the one or more functions is blocked.

Thus, in accordance with some embodiments, in response to detection of an electrostatic event in the facility, the controller 514 controls the equipment of the facility equipment 502 to automatically perform one or more actions, comprising at least one of cease operation, change modes, block one or more functions, or other action, that prevent the detected electrostatic event from causing damage to one or more components in the facility by at least one of ESD, arcing, micro-arcing, or other event.

A method 700 of determining measures of electrostatic field strength is illustrated in FIG. 7 in accordance with some embodiments. At 702, a laser signal is emitted to a semiconductor fabrication component. In some embodiments, the laser signal corresponds to the laser signal 108, and the semiconductor fabrication component corresponds to the component 104. At 704, a reflection signal is received. The reflection signal comprises light, of the laser signal, reflected by a surface of the semiconductor fabrication component. In some embodiments, the reflection signal corresponds to the reflection signal 118. At 706, the reflection signal is filtered to provide filtered light that has a wavelength within a defined range of wavelengths. In some embodiments, the defined range of wavelengths corresponds to the defined range of wavelengths 128. At 708, an electrical signal is generated based upon the filtered light. At 710, measures of electrostatic field strength at the surface of the semiconductor fabrication component are determined based upon the electrical signal.

A method 800 of determining measures of electrostatic field strength and/or detecting an electrostatic event is illustrated in FIG. 8 in accordance with some embodiments. At 802, a laser signal is emitted to a semiconductor fabrication component. In some embodiments, the laser signal corresponds to the laser signal 108, and the semiconductor fabrication component corresponds to the component 104. At 804, a reflection signal is received. The reflection signal comprises light, of the laser signal, reflected by a surface of the semiconductor fabrication component. In some embodiments, the reflection signal corresponds to the reflection signal 118. At 806, the reflection signal is filtered to provide filtered light that has a wavelength within a defined range of wavelengths. In some embodiments, the defined range of wavelengths corresponds to the defined range of wavelengths 128. At 808, an electrical signal is generated based upon the filtered light. At 810, measures of electrostatic field strength at the surface of the semiconductor fabrication component are determined based upon the electrical signal. At 812, an electrostatic field strength map is generated based upon the measures of electrostatic field strength. In some embodiments, the electrostatic field strength map comprises the electrostatic field strength image 240 or the electrostatic field strength image 432. At 814, at least one of the electrostatic field strength map is displayed on a display, or an electrostatic event is detected based upon the electrostatic field strength map. In some embodiments, the display corresponds to at least one of the display 142 or the display 602. In some embodiments, the electrostatic event corresponds to the first electrostatic event 242, the second electrostatic event 244, the third electrostatic event 428, or the fourth electrostatic event 430.

A semiconductor processing method 900 is illustrated in FIG. 9, in accordance with some embodiments. At 902, a semiconductor wafer is received in a processing chamber of a semiconductor fabrication component. In some embodiments, at least one of the semiconductor wafer corresponds to the semiconductor wafer 310, the processing chamber corresponds to the semiconductor processing chamber 304, or the semiconductor fabrication component corresponds to the component 104. In some embodiments, the semiconductor wafer is positioned on a wafer support, such as the wafer support 312, in the processing chamber. In some embodiments, the semiconductor wafer comprises at least one of a semiconductor substrate, one or more semiconductor layers, one or more epitaxial layers, etc. At 904, a laser signal is emitted to the semiconductor wafer. In some embodiments, the laser signal corresponds to the laser signal 108. At 906, a reflection signal is received. The reflection signal comprises light, of the laser signal, reflected by a surface of the semiconductor wafer. In some embodiments, the reflection signal corresponds to the reflection signal 118. At 908, the reflection signal is filtered to provide filtered light that has a wavelength within a defined range of wavelengths. In some embodiments, the defined range of wavelengths corresponds to the defined range of wavelengths 128. At 910, an electrical signal is generated based upon the filtered light. In an example, the electrical signal is indicative of a set of electrical signal data determined based upon the filtered light, such as representative of information regarding wavelength, frequency, magnitude, etc. At 912, one or more measures of electrostatic field strength at the surface of the semiconductor wafer are determined based upon the electrical signal. In some embodiments, the one or more measures of electrostatic field strength are determined based upon the set of electrical signal data. At 914, using the semiconductor fabrication component, a semiconductor fabrication process is performed on the semiconductor wafer based upon the one or more measures of electrostatic field strength. In some embodiments, one or more parameters of the semiconductor fabrication process are controlled based upon the one or more measures of electrostatic field strength.

In some embodiments, the semiconductor fabrication process is started in response to a determination that a first measure of electrostatic field strength of the one or more measures of electrostatic field strength meets a first threshold, such as a first threshold measure of electrostatic field strength. In some embodiments, the semiconductor fabrication component initiates performing the semiconductor fabrication process when the semiconductor fabrication process is started. In some embodiments, the first measure of electrostatic field strength meets the first threshold when the first measure of electrostatic field strength exceeds the first threshold. In some embodiments, the first measure of electrostatic field strength meets the first threshold when the first measure of electrostatic field strength is less than the first threshold. In some embodiments, the semiconductor fabrication process is started in response to a determination that one, some, and/or all of the one or more measures of electrostatic field strength meet the first threshold. In some embodiments, the semiconductor fabrication process is started in response to a determination that at least a threshold proportion of the one or more measures of electrostatic field strength meet the first threshold.

In some embodiments, the semiconductor fabrication process is completed in response to a determination that a second measure of electrostatic field strength of the one or more measures of electrostatic field strength meets a second threshold, such as a second threshold measure of electrostatic field strength. The second measure of electrostatic field strength is the same as or different than the first measure of electrostatic field strength. The second threshold is the same as or different than the first threshold. In some embodiments, the semiconductor fabrication component initiates one or more completion acts of the semiconductor fabrication process to complete the semiconductor fabrication process. In some embodiments, the one or more completion acts comprise at least one of rinsing the semiconductor wafer, drying the semiconductor wafer, or other completion act. In some embodiments, the semiconductor fabrication component stops performing acts of the semiconductor fabrication process to complete the semiconductor fabrication process. In some embodiments, the second measure of electrostatic field strength meets the second threshold when the second measure of electrostatic field strength exceeds the second threshold. In some embodiments, the second measure of electrostatic field strength meets the second threshold when the second measure of electrostatic field strength is less than the second threshold. In some embodiments, the semiconductor fabrication process is completed in response to a determination that one, some, and/or all of the one or more measures of electrostatic field strength meet the second threshold. In some embodiments, the semiconductor fabrication process is completed in response to a determination that at least a threshold proportion of the one or more measures of electrostatic field strength meet the second threshold.

In some embodiments, a first semiconductor fabrication act of the semiconductor fabrication process is performed in response to a determination that a third measure of electrostatic field strength of the one or more measures of electrostatic field strength meets a third threshold, such as a third threshold measure of electrostatic field strength. The third measure of electrostatic field strength is the same as or different than at least one of the first measure of electrostatic field strength or the second measure of electrostatic field strength. The third threshold is the same as or different than at least one of the first threshold or the second threshold. In some embodiments, the first semiconductor fabrication act corresponds to at least a portion of the semiconductor fabrication process. In some embodiments, the third measure of electrostatic field strength meets the third threshold when the third measure of electrostatic field strength exceeds the third threshold. In some embodiments, the third measure of electrostatic field strength meets the third threshold when the third measure of electrostatic field strength is less than the third threshold. In some embodiments, the first semiconductor fabrication act is performed in response to a determination that one, some, and/or all of the one or more measures of electrostatic field strength meet the third threshold. In some embodiments, the first semiconductor fabrication act is performed in response to a determination that at least a threshold proportion of the one or more measures of electrostatic field strength meet the third threshold.

In some embodiments, the one or more measures of electrostatic field strength are analyzed to determine whether or not there is an electrostatic event at least one of at the semiconductor wafer or in the processing chamber. In some embodiments, the semiconductor fabrication process is started in response to a determination that there is not an electrostatic event at least one of at the semiconductor wafer or in the processing chamber. In some embodiments, the semiconductor fabrication process is completed in response to a determination that there is not an electrostatic event at least one of at the semiconductor wafer or in the processing chamber. In some embodiments, the first semiconductor fabrication act of the semiconductor fabrication process is performed in response to a determination that there is not an electrostatic event at least one of at the semiconductor wafer or in the processing chamber. In some embodiments, the semiconductor fabrication process is not started in response to detecting, based upon the one or more measures of electrostatic field strength, an electrostatic event at least one of at the semiconductor wafer or in the processing chamber. In some embodiments, the semiconductor fabrication process is not completed in response to detecting the electrostatic event. In some embodiments, the first semiconductor fabrication act of the semiconductor fabrication process is not performed in response to detecting the electrostatic event. In some embodiments, the semiconductor fabrication process is at least one of cancelled or postponed in response to detecting the electrostatic event. In some embodiments, in response to detecting the electrostatic event, one or more maintenance operations are performed to at least one of repair the semiconductor fabrication component, repair the semiconductor wafer, or remove electrostatic charge associated with the electrostatic event, thereby at least one of mitigating or preventing damage that could otherwise be caused by the electrostatic event.

In some embodiments, performing the semiconductor fabrication process comprises at least one of (i) performing a PVD process on the semiconductor wafer, (ii) performing a CVD process on the semiconductor wafer, (iii) performing a plating process on the semiconductor wafer, such as electroplating the semiconductor wafer to coat a surface of the semiconductor wafer with one or more metal layers, (iv) performing an etching process, such as plasma etching or other type of etching, on the semiconductor wafer, (v) performing a lithographic exposure process, such as extreme ultraviolet lithography (EUV) or other type of lithographic exposure process, on the semiconductor wafer, (vi) performing a CMP process on the semiconductor wafer, (vii) performing a doping process on the semiconductor wafer, such as performing one or more dopant implantation processes to implant dopants into the semiconductor wafer, or (viii) performing a diffusion process on the semiconductor wafer.

Figure 10:
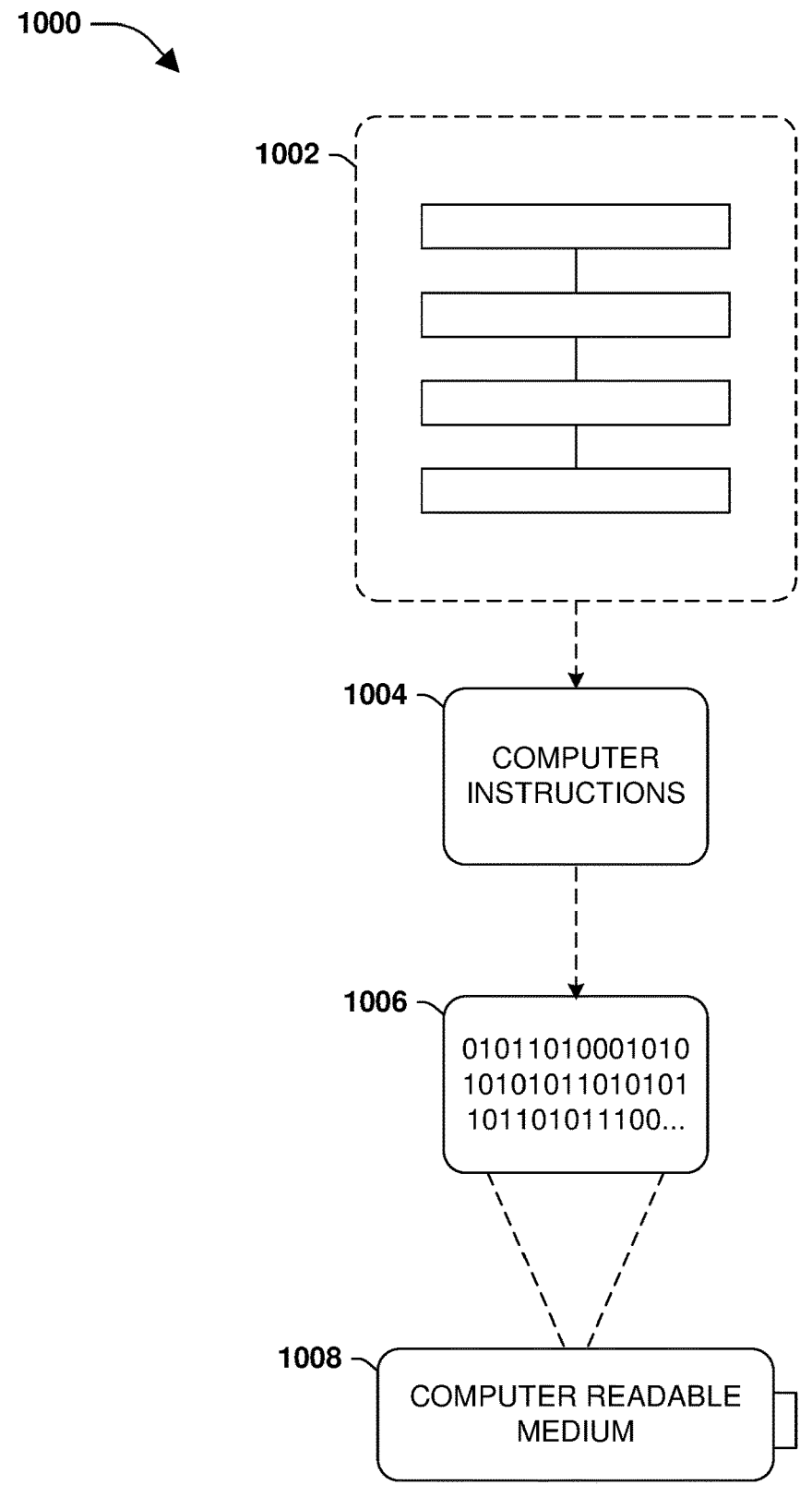
FIG. 10 illustrates an example computer-readable medium wherein processor-executable instructions configured to embody one or more of the provisions set forth herein may be comprised, according to some embodiments.

One or more embodiments involve a computer-readable medium comprising processor-executable instructions configured to implement one or more of the techniques presented herein. An exemplary computer-readable medium is illustrated in FIG. 10, wherein the embodiment 1000 comprises a computer-readable medium 1008 (e.g., a CD-R, DVD-R, flash drive, a platter of a hard disk drive, etc.), on which is encoded computer-readable data 1006. This computer-readable data 1006 in turn comprises a set of processor-executable computer instructions 1004 configured to implement one or more of the principles set forth herein when executed by a processor. In some embodiments 1000, the processor-executable computer instructions 1004 are configured to implement a method 1002, such as at least some of the aforementioned method(s) when executed by a processor. In some embodiments, the processor-executable computer instructions 1004 are configured to implement a system, such as at least some of the one or more aforementioned systems when executed by a processor. In some embodiments, the processor-executable computer instructions 1004 are configured to implement an apparatus, such as at least some of the one or more aforementioned apparatuses when executed by a processor. Many such computer-readable media may be devised by those of ordinary skill in the art that are configured to operate in accordance with the techniques presented herein.

In some embodiments, an apparatus is provided. The apparatus includes a laser generation device configured to emit a laser signal to a semiconductor fabrication component. The apparatus includes a reflection detection device configured to receive a reflection signal comprising light, of the laser signal, reflected by a surface of the semiconductor fabrication component. The reflection detection device includes an optical filter. The optical filter is configured to block light, of the reflection signal, that has a wavelength outside a defined range of wavelengths. The optical filter is configured to provide filtered light, from the reflection signal, that has a wavelength within the defined range of wavelengths. The reflection detection device includes a light sensor configured to generate an electrical signal based upon the filtered light. The apparatus includes a computer configured to determine, based upon the electrical signal, measures of electrostatic field strength at the surface of the semiconductor fabrication component.

In some embodiments, a method is provided. The method includes emitting a laser signal to a semiconductor fabrication component. The method includes receiving a reflection signal comprising light, of the laser signal, reflected by a surface of the semiconductor fabrication component. The method includes filtering the reflection signal to provide filtered light that has a wavelength within a defined range of wavelengths. The method includes generating an electrical signal based upon the filtered light. The method includes determining, based upon the electrical signal, measures of electrostatic field strength at the surface of the semiconductor fabrication component.

In some embodiments, a semiconductor processing method is provided. The method includes receiving, in a processing chamber of a semiconductor fabrication component, a semiconductor wafer. The method includes emitting a laser signal to the semiconductor wafer. The method includes receiving a reflection signal comprising light, of the laser signal, reflected by a surface of the semiconductor wafer. The method includes filtering the reflection signal to provide filtered light that has a wavelength within a defined range of wavelengths. The method includes generating an electrical signal based upon the filtered light. The method includes determining, based upon the electrical signal, one or more measures of electrostatic field strength at the surface of the semiconductor wafer. The method includes performing, using the semiconductor fabrication component and based upon the one or more measures of electrostatic field strength, a semiconductor fabrication process on the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. An apparatus, comprising:
a laser generation device configured to emit a laser signal to a semiconductor fabrication component;
a reflection detection device configured to receive a reflection signal comprising light, of the laser signal, reflected by a surface of the semiconductor fabrication component, wherein the reflection detection device comprises:
an optical filter configured to:
block light, of the reflection signal, that has a wavelength outside a defined range of wavelengths; and
provide filtered light, from the reflection signal, that has a wavelength within the defined range of wavelengths; and
a light sensor configured to generate an electrical signal based upon the filtered light; and
a computer configured to:
determine, based upon the electrical signal, measures of electrostatic field strength at the surface of the semiconductor fabrication component;
generate an electrostatic field strength map based upon the measures of electrostatic field strength; and
detect an electrostatic event, based upon the electrostatic field strength map, using a trained machine learning model trained using electrostatic field strength maps generated over a period of time.

2. The apparatus of claim 1, wherein:
the laser signal is generated by the laser generation device to have a first wavelength; and
the defined range of wavelengths comprises a second wavelength equal to half of the first wavelength.

3. The apparatus of claim 2, wherein:
the defined range of wavelengths ranges from a third wavelength larger than half of the second wavelength to a fourth wavelength smaller than the first wavelength.

4. The apparatus of claim 1, wherein:
the reflection detection device comprises one or more lenses configured to conduct the reflection signal to the optical filter.

5. The apparatus of claim 1, wherein:
the light sensor comprises an array of photodiodes.

6. The apparatus of claim 1, wherein the computer is configured to:

determine a pixel color based upon a measure of electrostatic field strength of the measures of electrostatic field strength; and generate one or more pixels of the electrostatic field strength map according to the pixel color.

7. The apparatus of claim 6, comprising:

a display configured to display the one or more pixels of the electrostatic field strength map.

8. The apparatus of claim 1, wherein the computer is configured to:

at least one of:

display an alert, indicative of the electrostatic event, via a display; or provide a signal indicative of the electrostatic event.

9. The apparatus of claim 1, wherein the semiconductor fabrication component comprises at least one of:

physical vapor deposition (PVD) equipment;

chemical vapor deposition (CVD) equipment;

plating equipment;

etching equipment;

lithography equipment;

chemical mechanical planarization (CMP) equipment;

semiconductor wafer storage equipment;

a processing chamber;

a component that utilizes plasma;

a tube;

a manifold; or fluid storage equipment.

10. A method, comprising:

retrieving a plurality of electrostatic field strength maps generated in association with a semiconductor fabrication component over a period of time;

training a machine learning model using the plurality of electrostatic field strength maps to generate a trained machine learning model;

emitting a laser signal to the semiconductor fabrication component;

receiving a reflection signal comprising light, of the laser signal, reflected by a surface of the semiconductor fabrication component;

filtering the reflection signal to provide filtered light that has a wavelength within a defined range of wavelengths;

generating an electrical signal based upon the filtered light; and determining, based upon the electrical signal, measures of electrostatic field strength at the surface of the semiconductor fabrication component;

generating an electrostatic field strength map based upon the measures of electrostatic field strength; and detecting an electrostatic event based upon the electrostatic field strength map wherein detecting the electrostatic event is performed using the trained machine learning model.

11. The method of claim 10, comprising:

at least one of:

displaying an alert, indicative of the electrostatic event, via a display; or providing a signal indicative of the electrostatic event.

12. The method of claim 10, wherein:

filtering the reflection signal to provide the filtered light is performed using a bandpass filter.

13. The method of claim 10, wherein:

the laser signal is generated to have a first wavelength; and the defined range of wavelengths comprises a second wavelength equal to half of the first wavelength.

14. The method of claim 13, wherein:

the defined range of wavelengths ranges from a third wavelength larger than half of the second wavelength to a fourth wavelength smaller than the first wavelength.

15. A semiconductor processing method, comprising:

retrieving a plurality of electrostatic field strength maps generated in association with a semiconductor fabrication component over a period of time;

training a machine learning model using the plurality of electrostatic field strength maps to generate a trained machine learning model;

receiving, in a processing chamber of the semiconductor fabrication component, a semiconductor wafer;

emitting a laser signal to the semiconductor wafer;

receiving a reflection signal comprising light, of the laser signal, reflected by a surface of the semiconductor wafer;

filtering the reflection signal to provide filtered light that has a wavelength within a defined range of wavelengths;

generating an electrical signal based upon the filtered light;

determining, based upon the electrical signal, one or more measures of electrostatic field strength at the surface of the semiconductor wafer;

performing, using the semiconductor fabrication component and based upon the one or more measures of electrostatic field strength, a semiconductor fabrication process on the semiconductor wafer;

generating an electrostatic field strength map based upon the one or more measures of electrostatic field strength; and detecting an electrostatic event based upon the electrostatic field strength map wherein detecting the electrostatic event is performed using the trained machine learning model.

16. The method of claim 15, wherein performing the semiconductor fabrication process comprises at least one of:

starting the semiconductor fabrication process in response to a determination that a first measure of electrostatic field strength of the one or more measures of electrostatic field strength meets a first threshold;

completing the semiconductor fabrication process in response to a determination that a second measure of electrostatic field strength of the one or more measures of electrostatic field strength meets a second threshold; or performing a semiconductor fabrication act, of the semiconductor fabrication process, in response to a determination that a third measure of electrostatic field strength of the one or more measures of electrostatic field strength meets a third threshold.

17. The method of claim 15, wherein performing the semiconductor fabrication process comprises at least one of:

performing a physical vapor deposition (PVD) process on the semiconductor wafer;

performing a chemical vapor deposition (CVD) process on the semiconductor wafer;

performing a plating process on the semiconductor wafer;

performing an etching process on the semiconductor wafer;

performing a lithographic exposure process on the semiconductor wafer;

performing a chemical mechanical planarization (CMP) process on the semiconductor wafer;

performing a doping process on the semiconductor wafer; or performing a diffusion process on the semiconductor wafer.

18. The method of claim 15, comprising:

displaying an alert, indicative of the electrostatic event, via a display.

19. The method of claim 15, comprising:

providing a signal indicative of the electrostatic event.

20. The method of claim 15, wherein:

the laser signal is generated to have a first wavelength; and the defined range of wavelengths comprises a second wavelength equal to half of the first wavelength.

\* \* \* \* \*